(12) United States Patent
Miura et al.

(10) Patent No.: US 12,072,625 B2
(45) Date of Patent: Aug. 27, 2024

(54) NOZZLE UNIT, LIQUID TREATMENT APPARATUS, AND LIQUID TREATMENT METHOD

(71) Applicant: Tokyo Electron Limited, Tokyo (JP)

(72) Inventors: Takuya Miura, Koshi (JP); Kouichirou Tanaka, Koshi (JP); Shogo Takahashi, Koshi (JP); Yusuke Miyakubo, Koshi (JP); Kentaro Yoshihara, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 483 days.

(21) Appl. No.: 17/238,541

(22) Filed: Apr. 23, 2021

(65) Prior Publication Data

US 2021/0333707 A1 Oct. 28, 2021

(30) Foreign Application Priority Data

Apr. 28, 2020 (JP) .................................. 2020-079398
Oct. 1, 2020 (JP) .................................. 2020-167147

(51) Int. Cl.
*G03F 7/00* (2006.01)
(52) U.S. Cl.
CPC ................................. *G03F 7/0025* (2013.01)

(58) Field of Classification Search
CPC ............ G03F 7/0025; G03F 7/16; G03F 7/30; H01L 21/6715; B05B 7/00; B05B 13/0278; B05D 3/0406; B05D 3/0426
See application file for complete search history.

(56) References Cited

U.S. PATENT DOCUMENTS

| 10,289,005 | B2 * | 5/2019 | Lee ........................... G03F 7/40 |
| 10,985,038 | B2 * | 4/2021 | Naohara ........... H01L 21/67051 |
| 2020/0309150 | A1 * | 10/2020 | Yamashita .......... F04D 29/4206 |

FOREIGN PATENT DOCUMENTS

JP 2004-274028 A 9/2004

* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

A nozzle unit for a liquid treatment apparatus that performs a liquid treatment on a substrate using a liquid, includes a first gas nozzle having a discharge flow path for allowing a first gas to flow through the discharge flow path and a first discharge port for discharging the first gas flowing through the discharge flow path toward a surface of the substrate, wherein the first discharge port is formed so as to extend in a first direction along the surface, and wherein a width of the discharge flow path in the first direction increases as the discharge flow path approaches the first discharge port, so that the first gas is discharged radially from the first discharge port.

9 Claims, 25 Drawing Sheets

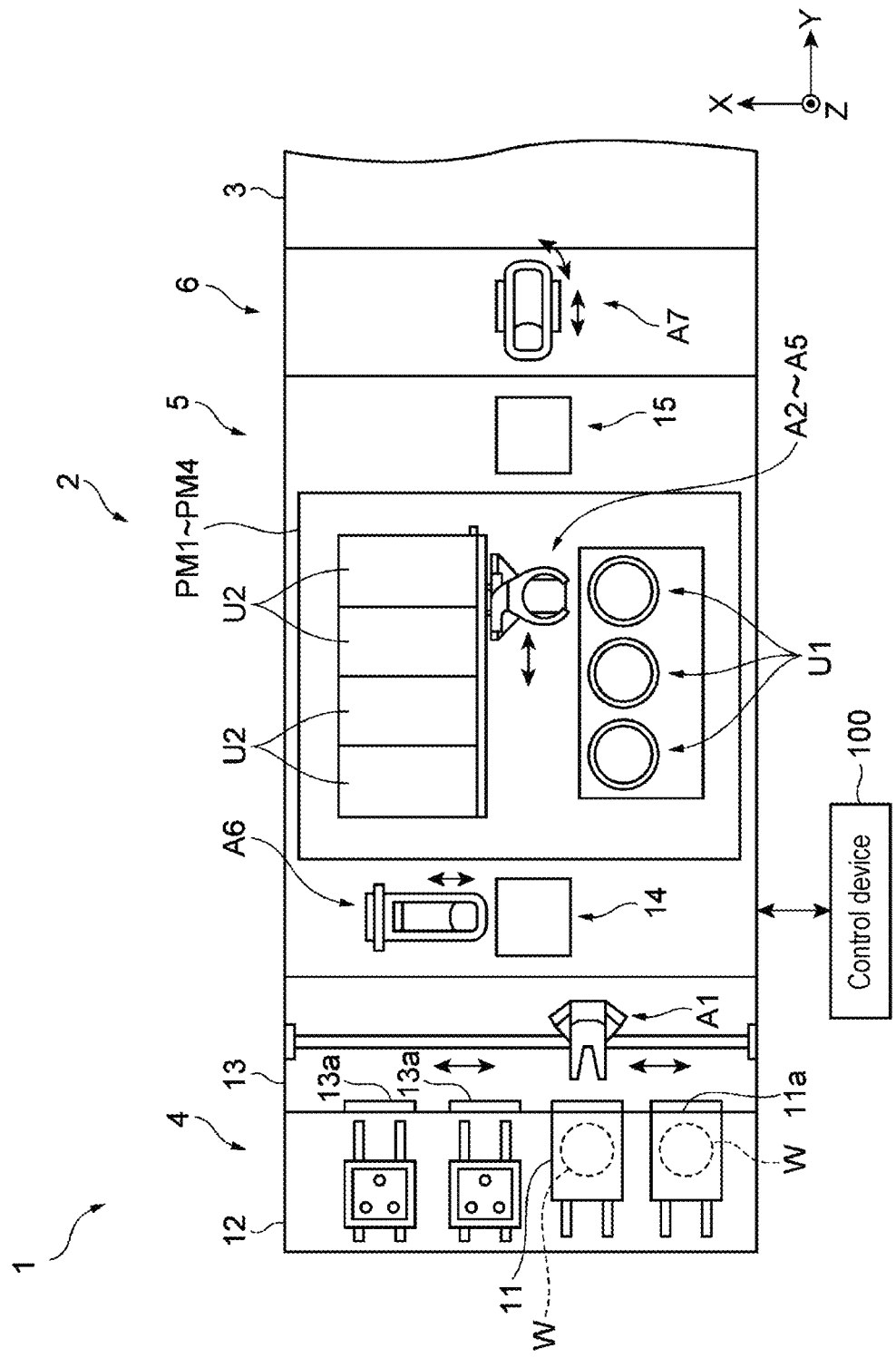

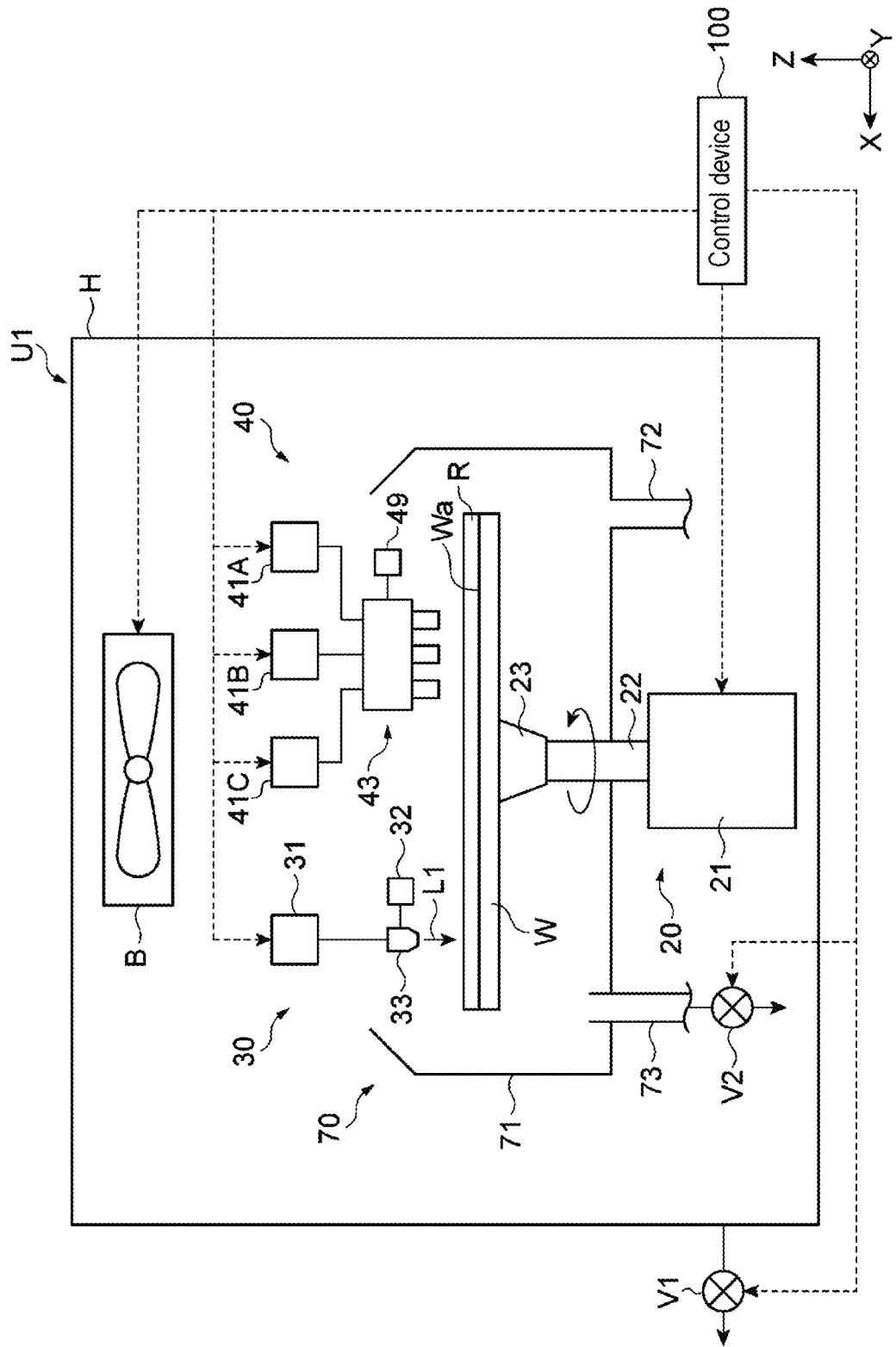

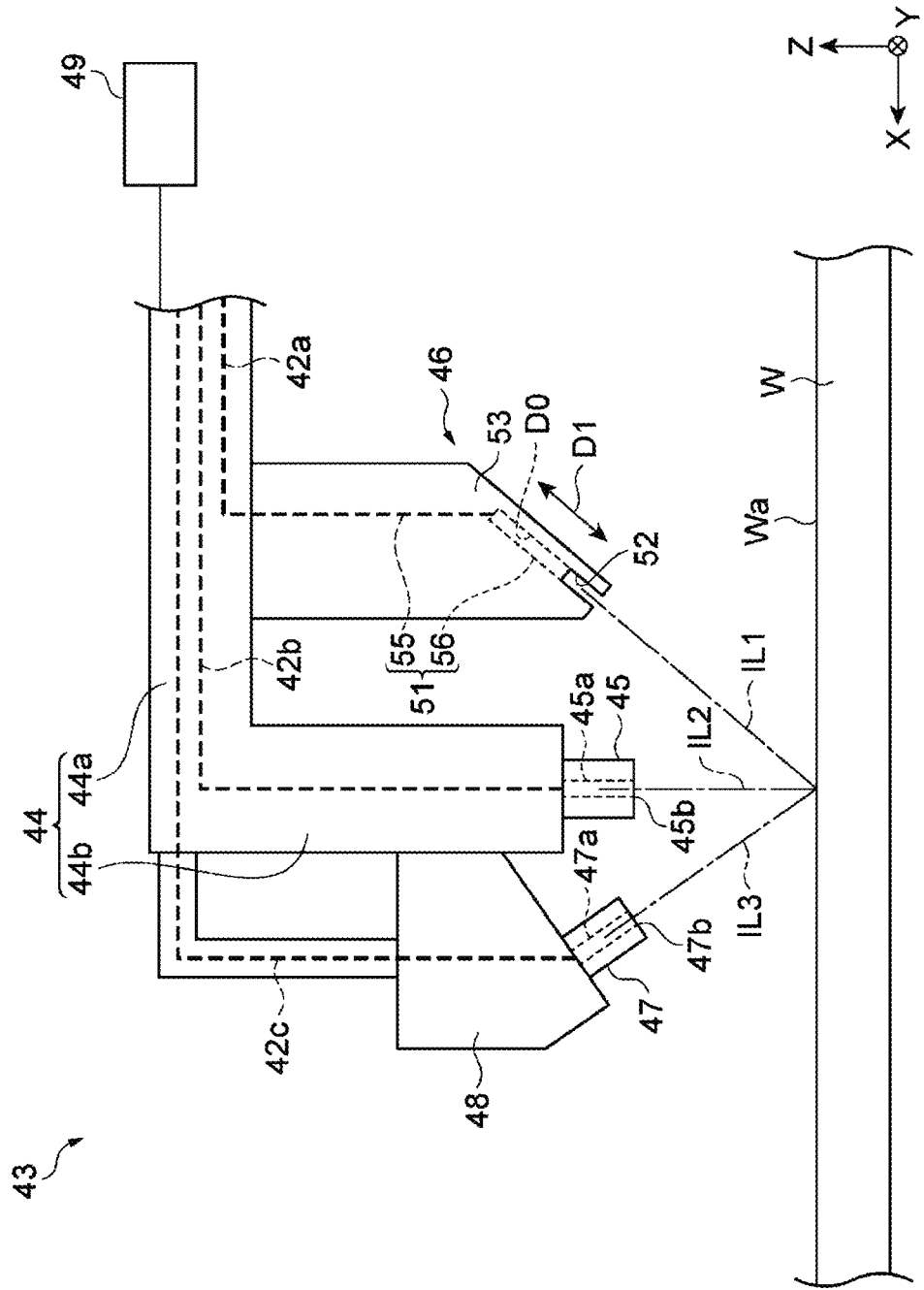

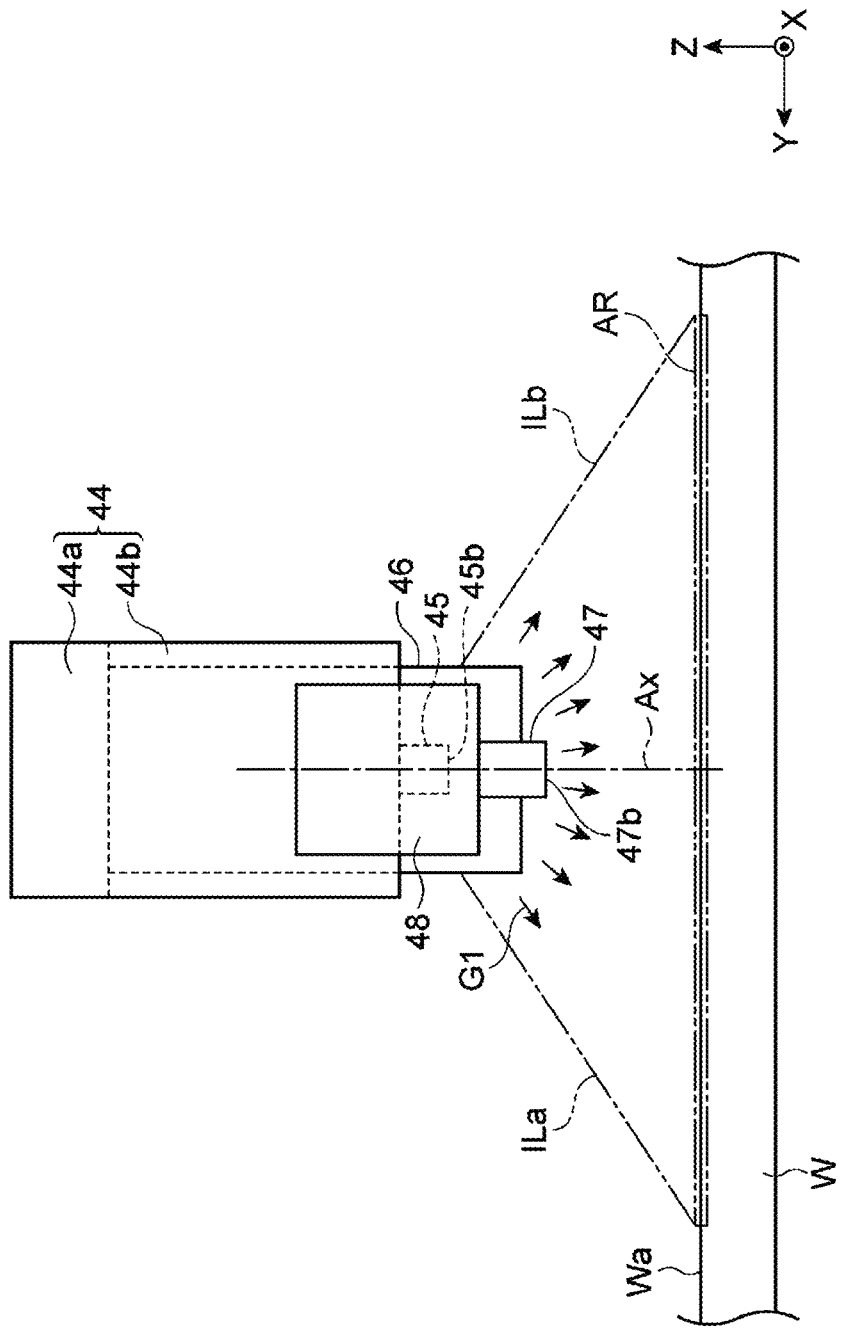

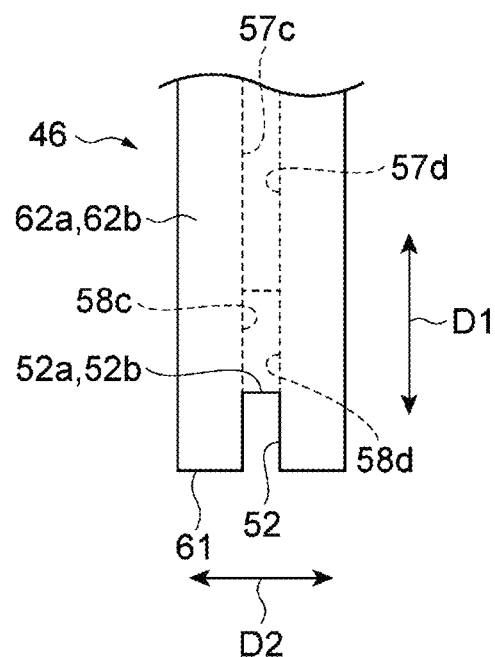

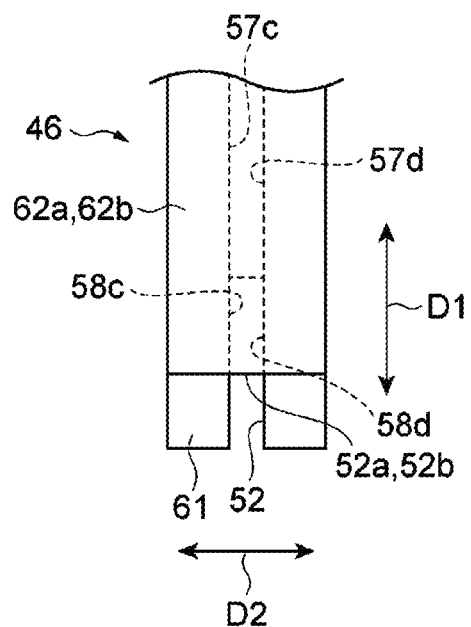

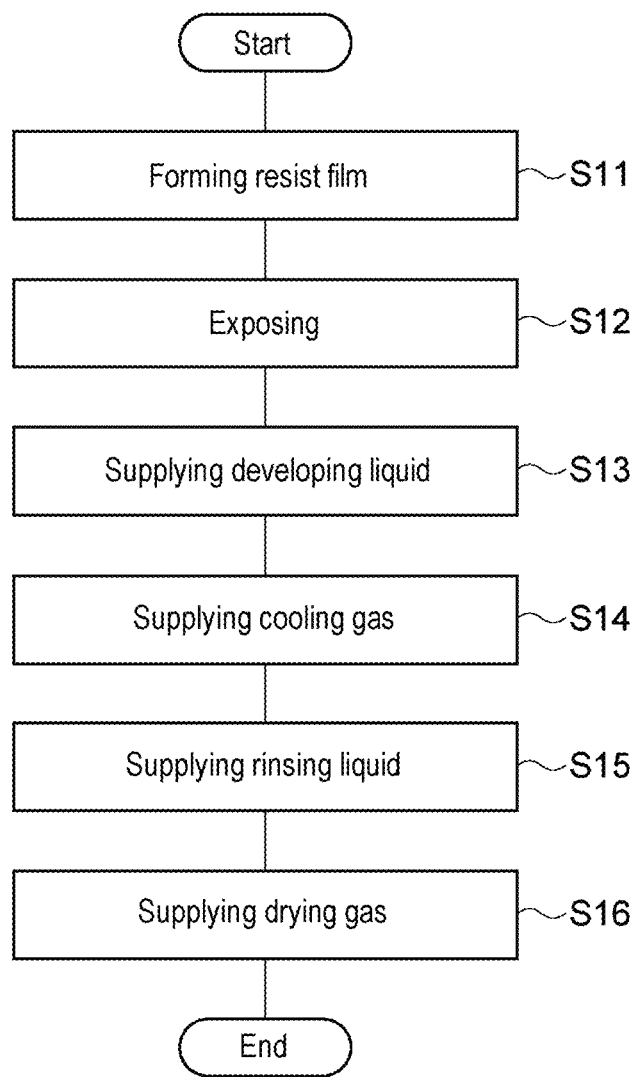

NOZZLE UNIT, LIQUID TREATMENT APPARATUS, AND LIQUID TREATMENT METHOD

CROSS-REFERENCE TO RELATED APPLICATIONS

This application is based upon and claims the benefit of priority from Japanese Patent Application No. 2020-079398, filed on Apr. 28, 2020, and Japanese Patent Application No. 2020-167147, filed on Oct. 1, 2020, the entire contents of which are incorporated herein by reference.

TECHNICAL FIELD

The present disclosure relates to a nozzle unit, a liquid treatment apparatus and a liquid treatment method.

BACKGROUND

Patent Document 1 discloses a developing apparatus configured to develop a resist film formed on a surface of a substrate by supplying a developing liquid to the surface of the substrate. The developing apparatus includes a blower that blows air adjusted to a predetermined temperature onto a substrate from above, and a temperature regulator configured to maintain a chuck device and a developing liquid supply pipe at a predetermined temperature by circulating temperature-regulating water adjusted to a predetermined temperature.

PRIOR ART DOCUMENT

Patent Document

Patent Document 1: Japanese Laid-Open Patent Publication No. 2004-274028

SUMMARY

A nozzle unit according to an aspect of the present disclosure is a unit for use in a liquid treatment apparatus that performs a liquid treatment on a substrate using a liquid. The nozzle unit includes a first gas nozzle having a discharge flow path for allowing a first gas to flow through the discharge flow path and a first discharge port for discharging the first gas flowing through the discharge flow path toward a surface of the substrate. The first discharge port is formed so as to extend in a first direction along the surface. A width of the discharge flow path in the first direction increases as the discharge flow path approaches the first discharge port, so that the first gas is discharged radially from the first discharge port.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a top view schematically showing an example of the interior of the substrate processing system.

FIG. 4 is a schematic diagram showing an example of a liquid treatment unit.

FIG. 5 is a side view schematically showing an example of a nozzle unit.

FIG. 6 is another side view schematically showing an example of the nozzle unit.

FIGS. 7A to 7C are schematic diagrams showing an example of a gas nozzle.

FIGS. 8A to 8C are schematic diagrams showing another example of the gas nozzle.

FIG. 12 is a flowchart showing an example of a liquid treatment method.

DETAILED DESCRIPTION

Figure 1:
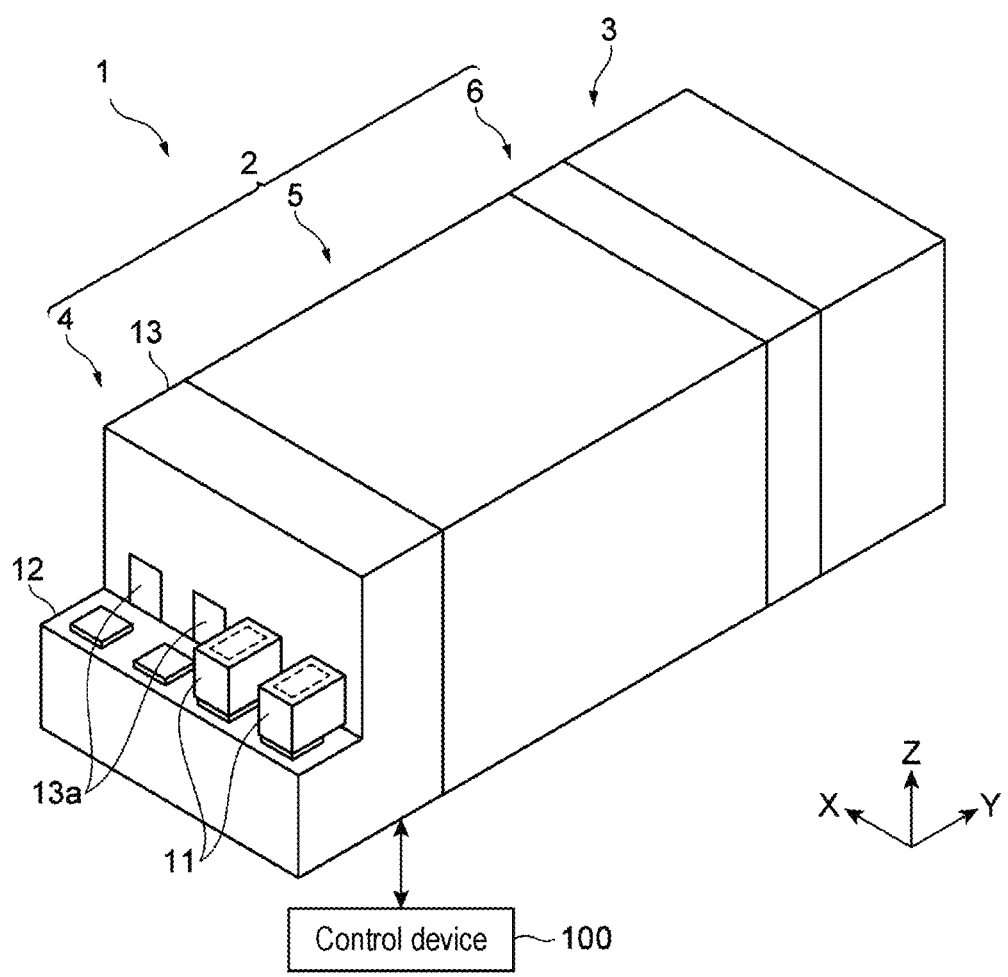
FIG. 1 is a perspective view showing an example of a substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described.

A nozzle unit according to one exemplary embodiment is a unit for use in a liquid treatment apparatus that performs a liquid treatment on a substrate using a liquid. The nozzle unit includes a first gas nozzle having a discharge flow path for allowing a first gas to flow through the discharge flow path and a first discharge port for discharging the first gas flowing through the discharge flow path toward a surface of the substrate. The first discharge port is formed so as to extend in a first direction along the surface. A width of the discharge flow path in the first direction increases as the discharge flow path approaches the first discharge port, so that the first gas is discharged radially from the first discharge port.

In this nozzle unit, the first gas from the first discharge port of the first gas nozzle is radially discharged in the first direction in which the first discharge port extends. Therefore, the first gas from the first gas nozzle is supplied to a region of the surface of the substrate, which is longer than the width of the first discharge port in the first direction. Thus, the first gas can be discharged such that the region longer than the width of the first discharge port in the first direction is aligned with the central portion of the substrate. As a result, the central portion of the substrate, which is the region to which the first gas is supplied in the liquid treatment, is cooled more than the peripheral edge portion of the substrate. Accordingly, it is possible to improve uniformity of a temperature distribution in a plane of the substrate.

The first gas nozzle may be configured so that both ends of the first discharge port in the first direction are visually recognizable from the first direction. In this case, the first gas can be supplied to a wider range on the surface while suppressing an increase in a length of the first discharge port in the first direction. Accordingly, it is possible to simplify the nozzle unit.

A central portion of a plane of the first discharge port including an opening edge of the discharge port in the first direction may protrude toward the surface. In this case, in the discharge flow path, differences in the length of flow paths to the plane including the opening edge become small on the opening surface. Accordingly, it is possible to improve the uniformity of a flow velocity of the first gas in the plane including the opening edge.

The nozzle unit may further include a second gas nozzle having a second discharge port for discharging a second gas toward the surface, and a drive part configured to move the first gas nozzle and the second gas nozzle together along the surface. In this case, since the two nozzles can be moved by one drive part, it is possible to simplify the nozzle unit including the drive part.

The flow velocity of the first gas discharged from the first discharge port may be smaller than a flow velocity of the second gas discharged from the second discharge port. In this case, the first gas nozzle and the second gas nozzle can be used for different purposes.

The nozzle unit may further include a treatment liquid nozzle having a third discharge port for discharging a treatment liquid toward the surface. The drive part may move the first gas nozzle, the second gas nozzle, and the treatment liquid nozzle together. In this case, since the three nozzles can be moved by one drive part, it is possible to simplify the nozzle unit including the drive part.

The first gas nozzle and the treatment liquid nozzle may be arranged at different positions in a second direction orthogonal to the first direction and extending along the surface. The first gas nozzle and the treatment liquid nozzle may be configured so that a distance in the second direction between an arrival position of the first gas from the first gas nozzle on the surface and an arrival position of the treatment liquid from the treatment liquid nozzle on the surface is smaller than a distance in the second direction between the first discharge port and the third discharge port. In this case, it is possible to shorten a switching time between treatment processing using the first gas from the first gas nozzle and treatment processing using the treatment liquid from the treatment liquid nozzle.

The second gas nozzle and the treatment liquid nozzle may be arranged at different positions in the second direction. The second gas nozzle and the treatment liquid nozzle may be configured so that when viewed from the first direction, an inclination of a discharge direction of the treatment liquid from the treatment liquid nozzle with respect to the surface is smaller than an inclination of a discharge direction of the second gas from the second gas nozzle with respect to the surface. In this case, it is possible to suppress influences of the treatment liquid discharged from the treatment liquid nozzle on the surface of the substrate.

The first gas nozzle, the second gas nozzle, and the treatment liquid nozzle may be arranged in this order in the second direction. In this case, the nozzle unit can be configured such that gas supply paths to the first gas nozzle and the second gas nozzle are shortened.

A liquid treatment apparatus according to one exemplary embodiment includes: the nozzle unit described above; a substrate holding unit configured to hold and rotate a substrate with a surface facing upward; and a control unit configured to control the nozzle unit and the substrate holding unit. The control unit supplies the first gas by the first gas nozzle to a region including a central portion or the surface by causing the first gas nozzle to discharge the first gas in a state in which the substrate is rotated by the substrate holding unit, so that an extension direction of an arrival region of the first gas on the surface intersects a rotation direction of the substrate. In this case, since the first gas can be diffused and supplied even along a circumferential direction in the central portion of the substrate, a temperature in the central portion can be reduced as compared with a temperature in the peripheral edge portion of the substrate. Accordingly, it is possible to reduce a difference in temperature between the central portion and the peripheral edge portion in the plane of the substrate.

A liquid treatment method according to one exemplary embodiment includes while maintaining a state in which the treatment liquid remains on a substrate, supplying a gas from above the treatment liquid to at least a region more inward than a peripheral edge portion of an upper surface of the treatment liquid remaining on a substrate (a region not including a peripheral edge of a treatment liquid range), so that the gas is diffused in a radial direction of the substrate rather than a circumferential direction of the substrate.

In the above liquid treatment method, by supplying the gas, the substrate is cooled in the vicinity of the region to which the gas is supplied. Here, by supplying the gas to be diffused in the radial direction of the substrate rather than the circumferential direction of the substrate, the central portion is cooled further than the peripheral edge portion. Therefore, it is possible to improve the uniformity of the temperature distribution in the plane of the substrate.

While the gas is supplied toward the treatment liquid remaining on the substrate, a flow rate of the gas and a flow velocity of the gas may be adjusted so that a surface of the substrate is not exposed by a movement of the treatment liquid due to the supply of the gas. In this case, a part of a treated portion on the substrate suitable for temperature sensitivity of a chemical liquid can be cooled so that an adverse effect on the liquid treatment by an impact of the gas, such as roughening or breaking the film of the treatment liquid, does not occur.

A maintenance period from creating, on an entirety of the substrate, a state in which the treatment liquid remains on the substrate to starting removal of the treatment liquid from the substrate may include a non-supply period during which the gas is not supplied. In this case, a cooling status of the substrate by the gas can be adjusted by providing the non-supply period during which the gas is not supplied in the maintenance period. Accordingly, it is possible to improve the uniformity of the temperature distribution in the plane of the substrate.

The non-supply period may be provided in a first half of the maintenance period. By providing the non-supply period in the first half of the maintenance period, it is possible to improve the uniformity of the temperature distribution in the plane of the substrate throughout the maintenance period.

The supplying the gas may be performed while rotating the substrate, and the supplying the gas includes supplying the gas so that the gas reaches a region on the substrate that does not include a center of the substrate. When the gas is supplied while rotating the substrate, if the gas reaches the center of the substrate, a difference may occur in the gas supply amount between the center of the substrate and the peripheral edge portion. Therefore, by adjusting the supply position so that the gas does not reach the center, it is possible to more uniformly perform the cooling by the gas.

Hereinafter, one embodiment will be described with reference to the drawings. In the description, the same components or the components having the same function are designated by like reference numerals, and duplicate description thereof will be omitted. In some drawings, there is shown a Cartesian coordinate system defined by X, Y and Z axes. In the following embodiment, the Z-axis corresponds to a vertical direction and the X-axis and the Y-axis correspond to a horizontal direction.

Substrate Processing System

First, a configuration of a substrate processing system 1 will be described with reference to FIGS. 1 to 3. The substrate processing system 1 includes a coating and developing apparatus 2 (liquid treatment apparatus) and an exposure apparatus 3.

The coating and developing apparatus 2 is configured to form a resist film R on a surface Wa of a workpiece W. Further, the coating and developing apparatus 2 is configured to develop the resist film R. The exposure apparatus 3 is configured to transfer the workpiece W to and from the coating and developing apparatus 2 to perform an exposure process (pattern exposure) of the resist film R formed on the surface Wa of the workpiece W (see FIG. 4 and the like). The exposure apparatus 3 may selectively irradiate an exposure target portion of the resist film R with an energy ray by a method such as immersion exposure or the like.

The workpiece W to be processed is, for example, a substrate, or a substrate on which a film, a circuit or the like is formed by being subjected to a predetermined process. The substrate included in the workpiece W is, for example, a wafer containing silicon. The workpiece W (substrate) may be formed in a circular shape, or may be formed in a plate shape other than a circular shape, such as a polygonal shape or the like. The workpiece W may have a cutout portion formed by partially cutting out the workpiece W. The cutout portion may be, for example, a notch (a groove having a U-shape, a V-shape, or the like) or a straight portion (so-called orientation flat) extending linearly. The workpiece W to be processed may be a glass substrate, a mask substrate, an FPD (Flat Panel Display), or the like, or may be an intermediate bodies obtained by subjecting these substrates or the like to a predetermined process. The diameter of the workpiece W may be, for example, about 200 mm to 450 mm.

The energy ray may be, for example, ionizing radiation, non-ionizing radiation, or the like. The ionizing radiation is radiation that has energy enough to ionize atoms or molecules. The ionizing radiation may be, for example, an extreme ultraviolet (EUV) ray, an electron beam, an ion beam, an X-ray, an $\alpha$-ray, a $\beta$-ray, a $\gamma$-ray, a heavy particle beam, a proton beam, or the like. The non-ionizing radiation is radiation that does not have energy enough to ionize atoms or molecules. The non-ionizing radiation may be, for example, a g-ray, an i-ray, a KrF excimer laser beam, an ArF excimer laser beam, an $F_2$ excimer laser beam, or the like.

Coating and Developing Apparatus

The coating and developing apparatus 2 is configured to form the resist film R on the surface Wa of the workpiece W before the exposure process is performed by the exposure apparatus 3. Further, the coating and developing apparatus 2 is configured to develop the resist film R after the exposure process is performed by the exposure apparatus 3.

Figure 2:
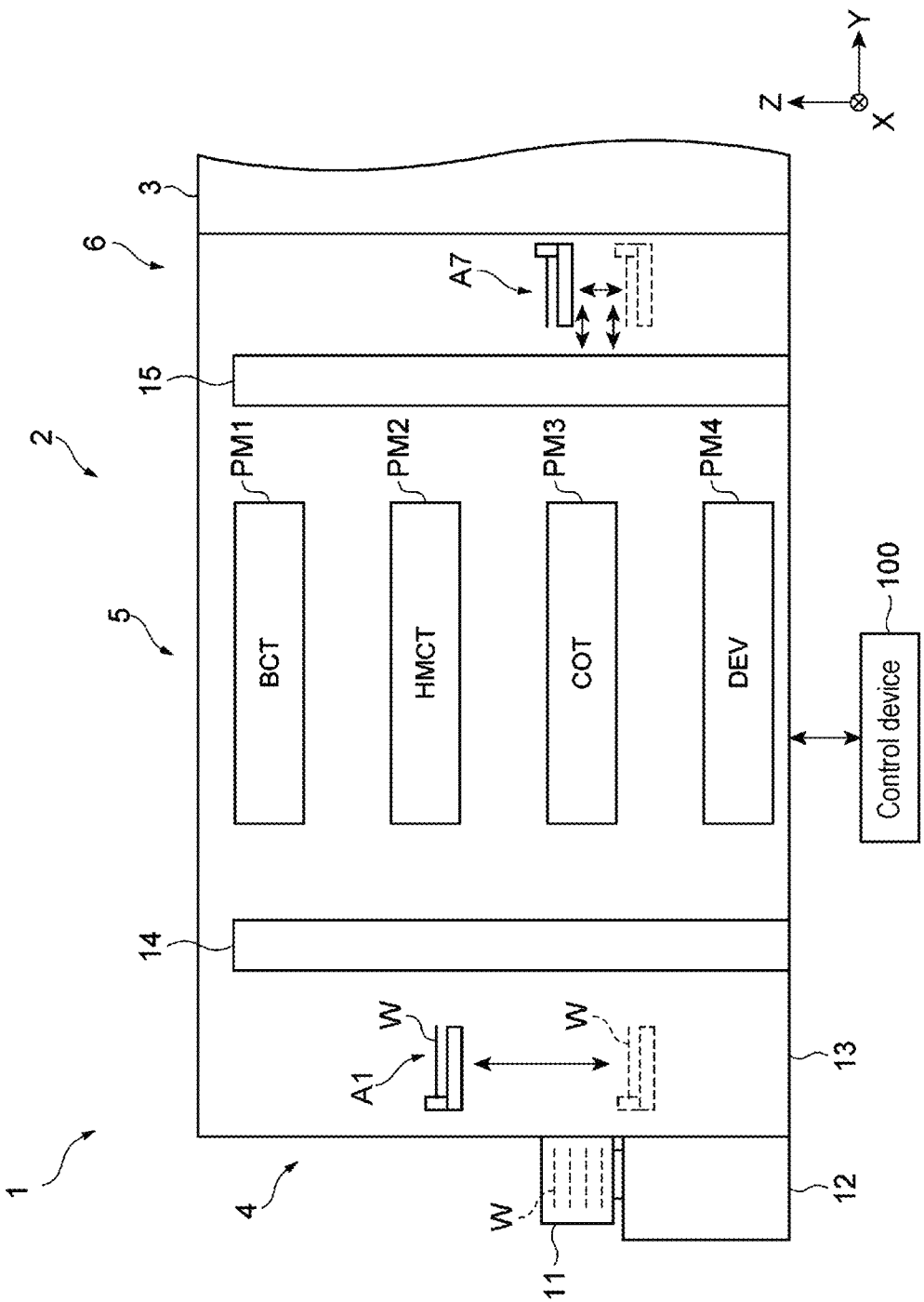
FIG. 2 is a side view schematically showing an example of the interior of the substrate processing system.

As shown in FIGS. 1 to 3, the coating and developing apparatus 2 includes a carrier block 4, a processing block 5, an interface block 6, and a control device 100 (control unit). The carrier block 4, the processing block 5 and the interface block 6 are arranged side by side in the horizontal direction.

The carrier block 4 includes a carrier station 12 and a loading and unloading part 13. The carrier station 12 supports a plurality of carriers 11. The carrier 11 accommodates at least one workpiece W in a sealed state. An opening and closing door (not shown) for taking in and out the workpiece W is provided on a side surface 11a of the carrier 11. The carrier 11 is detachably installed on the carrier station 12 so that the side surface 11a thereof faces the loading and unloading part 13.

The loading and unloading part 13 is located between the carrier station 12 and the processing block 5. The loading and unloading part 13 has a plurality of opening and closing doors 13a as shown in FIGS. 1 and 3. When the carrier 11 is placed on the carrier station 12, the opening and closing door of the carrier 11 comes into a state of facing the opening and closing door 13a. By opening the opening and closing door 13a and the opening and closing door of the side surface 11a at the same time, the interior of the carrier 11 and the interior of the loading and unloading part 13 communicate with each other. As shown in FIGS. 2 and 3, the loading and unloading part 13 includes a built-in transfer arm A1. The transfer arm A1 is configured to take out the workpiece W from the carrier 11 and deliver the workpiece W to the processing block 5, and is configured to receive the workpiece W from the processing block 5 and return the workpiece W into the carrier 11.

The processing block 5 includes processing modules PM1 to PM4 as shown in FIGS. 2 and 3.

The processing module PM1 is configured to form a lower layer film on the surface of the workpiece W, and is also called a BCT module. As shown in FIG. 3, the processing module PM1 includes a liquid treatment unit U1, a heat treatment unit U2, and a transfer arm A2 configured to transfer the workpiece W to the liquid treatment unit U1 and the heat treatment unit U2. The liquid treatment unit U1 of the processing module PM1 may be configured to, for example, apply a coating liquid for forming the lower layer film to the workpiece W. The heat treatment unit U2 of the processing module PM1 may be configured to, for example, perform a heat treatment for curing a coating film formed on the workpiece W by the liquid treatment unit U1 to form the lower layer film. Examples of the lower layer film include an antireflection (SiARC) film.

The processing module PM2 is configured to form an intermediate film (hard mask) on the lower layer film, and is also called an HMCT module. The processing module PM2 includes a liquid treatment unit U1, a heat treatment unit U2, and a transfer arm A3 configured to transfer the workpiece W to the liquid treatment unit U1 and the heat treatment unit U2. The liquid treatment unit U1 of the processing module PM2 may be configured to, for example, apply a coating liquid for forming the intermediate film to the workpiece W. The heat treatment unit U2 of the processing module PM2 may be configured to, for example, perform a heat treatment for curing a coating film formed on the workpiece W by the liquid treatment unit U1 to form the intermediate film. Examples of the intermediate film include an SOC (Spin-On-Carbon) film and an amorphous carbon film.

The processing module PM3 is configured to form a thermosetting photosensitive resist film R on the intermediate film, and is also called a COT module. The processing module PM3 includes a liquid treatment unit U1, a heat treatment unit U2, and a transfer arm A4 configured to transfer the workpiece W to the liquid treatment unit U1 and the heat treatment unit U2. The liquid treatment unit U1 of the processing module PM3 may be configured to, for example, apply a coating liquid (resist liquid) for forming the resist film to the workpiece W. The heat treatment unit U2 of the processing module PM3 may be configured to, for example, perform a heat treatment (PAB: Pre-Applied Bake) for curing a coating film formed on the workpiece W by the liquid treatment unit U1 to form the resist film R.

A resist material contained in the resist liquid may be a positive resist material or a negative resist material. The positive resist material is a resist material which is melted in an exposed pattern portion and left in an unexposed pattern portion (light-shielding portion). The negative resist material is a resist material which is melted in an unexposed pattern portion (light-shielding portion) and left in an exposed pattern portion.

The processing module PM4 is configured to develop the exposed resist film, and is also called a DEV module. The processing module PM4 includes a liquid treatment unit U1, a heat treatment unit U2, and a transfer arm A5 configured to transfer the workpiece W to the liquid treatment unit U1 and the heat treatment unit U2. The liquid treatment unit U1 of the processing module PM4 is configured to perform a developing process (liquid treatment) on the workpiece W using a liquid such as a developing liquid or the like. For example, the liquid treatment unit U1 of the processing module PM4 may be configured to partially remove the resist film R to form a resist pattern (not shown). The heat treatment unit U2 of the processing module PM4 may be configured to, for example, perform a heat treatment (PEB: Post Exposure Bake) before the developing process, a heat treatment (PB: Post Bake) after the developing process, and the like.

The processing block 5 includes a shelf unit 14 located in the vicinity of the carrier block 4, as shown in FIGS. 2 and 3. The shelf unit 14 extends in a vertical direction and includes a plurality of cells arranged along the vertical direction. A transfer arm A6 is provided in the vicinity of the shelf unit 14. The transfer arm A6 is configured to raise and lower the workpiece W among the cells of the shelf unit 14.

The processing block 5 includes a shelf unit 15 located in the vicinity of the interface block 6. The shelf unit 15 extends in the vertical direction and includes a plurality of cells arranged along the vertical direction.

The interface block 6 includes a built-in transfer arm A7 and is connected to the exposure apparatus 3. The transfer arm A7 is configured to take out the workpiece W from the shelf unit 15 and deliver the workpiece W to the exposure apparatus 3, and is configured to receive the workpiece W from the exposure apparatus 3 and return the workpiece W to the shelf unit 15.

Liquid Treatment Unit

Subsequently, the liquid treatment unit U1 of the processing module PM4 will be described in more detail with reference to FIGS. 4 to 6. As shown in FIG. 4, the liquid treatment unit U1 includes a substrate holder 20 (substrate holding unit), a supply 30, a supply 40, a cover 70, and a blower B, which are arranged in a housing H. An exhauster V1 configured to exhaust a gas in the housing H by operating based on a signal from the control device 100 is provided in a lower portion of the housing H. The exhauster V1 may be, for example, a damper capable of adjusting an exhaust amount according to an opening degree thereof. By adjusting the exhaust amount of the gas exhausted from the housing H by the exhauster V1, it is possible to control a temperature, pressure, humidity and the like inside the housing H. The exhauster V1 may be controlled so as to continuously evacuate the interior of the housing H during the liquid treatment for the workpiece W.

Substrate Holder

The substrate holder 20 is configured to hold and rotate the workpiece W. For example, the substrate holder 20 holds and rotates the workpiece W with the surface Wa facing upward. The substrate holder 20 includes a rotator 21, a shaft 22, and a holder 23.

The rotator 21 is operated based on an operation signal from the control device 100, and is configured to rotate the shaft 22. The rotator 21 is a power source such as an electric motor or the like. The holder 23 is provided at a tip end portion of the shaft 22. The workpiece W with the surface Wa thereof facing upward is arranged on the holder 23. The holder 23 is configured to hold the workpiece W substantially horizontally by, for example, attraction or the like. That is, the substrate holder 20 rotates the workpiece W about a central axis (rotation axis) perpendicular to the surface Wa of the workpiece W in a state in which the posture of the workpiece W is substantially horizontal. In the present embodiment, the surface Wa of the workpiece W held by the substrate holder 20 extends along an X-Y plane.

Supply

The supply 30 is configured to supply a treatment liquid L1 to the surface Wa of the workpiece W. The treatment liquid L1 may be, for example, a developing liquid. The supply 30 includes a supply mechanism 31, a drive mechanism 32 and a nozzle 33.

The supply mechanism 31 is configured to cause a liquid feeding mechanism (not shown) such as a pump or the like to feed the treatment liquid L1 stored in a container (not shown) based on a signal from the control device 100. The drive mechanism 32 is configured to move the nozzle 33 in a height direction and a horizontal direction based on a signal from the control device 100. The nozzle 33 is configured to discharge the treatment liquid L1 supplied from the supply mechanism 31 onto the surface Wa of the workpiece W.

Supply

The supply 40 is configured to supply a treatment liquid L2, a cooling gas G1 (first gas), and a drying gas G2 (second gas) to the surface Wa of the workpiece W. The treatment liquid L2 may be, for example, a rinsing liquid (cleaning liquid). The cooling gas G1 and the drying gas G2 are not particularly limited as long as they are gases, but may be an inert gas (e.g., nitrogen). The temperature of the cooling gas G1 and the drying gas G2 may be about 20 degrees C. to 25 degrees C. The supply 40 includes supply mechanisms 41A to 41C and a nozzle unit 43.

As shown in FIG. 4, the supply mechanism 41A is configured to cause a gas feeding mechanism (not shown) such as a pump or the like to feed the cooling gas G1 stored in a container (not shown) based on a signal from the control device 100. The supply mechanism 41B is configured to cause a gas feeding mechanism (not shown) such as a pump or the like to feed the drying gas G2 stored in a container (not shown) based on a signal from the control device 100. The supply mechanism 41C is configured to cause a liquid feeding mechanism (not shown) such as a pump or the like to feed the treatment liquid L2 stored in a container (not shown) based on a signal from the control device 100.

The nozzle unit 43 is configured to discharge the cooling gas G1, the drying gas G2, and the treatment liquid L2 supplied from the supply mechanisms 41A to 41C, respectively, to the surface Wa of the workpiece W. As shown in FIG. 5, the nozzle unit 43 includes a holding arm 44, a drying gas nozzle 45, a cooling gas nozzle 46, a treatment liquid nozzle 47, and a drive part 49 that moves the nozzles 45, 46, and 47 by moving the holding arm 44. Hereinafter, individual components of the nozzle unit 43 will be described.

Holding Arm

The holding arm 44 is configured to hold the drying gas nozzle 45, the cooling gas nozzle 46, and the treatment liquid nozzle 47. The holding arm 44 includes, for example, a horizontal portion 44a extending horizontally (in the X-axis direction in the drawings) and a vertical portion 44b extending in the vertical direction. One end of the horizontal portion 44a may be connected to the drive part 49 at a location that does not overlap with the workpiece W held by the substrate holder 20. An upper end of the vertical portion 44b is connected to the other end of the horizontal portion 44a. The vertical portion 44b extends downward (in the −Z direction) toward the surface Wa of the workpiece W from the tip end of the horizontal portion 44a. A lower end of the vertical portion 44b and the surface Wa of the workpiece W are spaced apart from each other in the vertical direction. A gas flow path 42a for allowing the cooling gas G1 supplied from the supply mechanism 41A to pass therethrough may be provided inside the holding arm 44. Furthermore, inside the holding arm 44, there may be provided a gas flow path 42b for allowing the drying gas G2 supplied from the supply mechanism 41B to flow therethrough and a treatment liquid flow path 42c for allowing the treatment liquid L2 supplied from the supply mechanism 41C to flow therethrough.

Drying Gas Nozzle

The drying gas nozzle 45 (second gas nozzle) is configured to discharge the drying gas G2 toward the surface Wa of the workpiece W. The drying gas nozzle 45 may discharge the drying gas G2 from above the surface Wa in a direction substantially perpendicular to the surface Wa. The discharge direction of the drying gas G2 from the drying gas nozzle 45 is substantially perpendicular to the surface Wa when viewed from each of the Y-axis direction and the X-axis direction.

In the example shown in FIG. 5, the drying gas nozzle 45 is provided at the lower end of the vertical portion 44b of the holding arm 44. The drying gas nozzle 45 is provided with a gas flow path 45a extending in the vertical direction. The gas flow path 45a is continuous from the gas flow path 42b, which passes through the horizontal portion 44a of the holding arm 44 and extends to the lower end of the vertical portion 44b. The drying gas nozzle 45 has a discharge port 45b (second discharge port) for discharging the drying gas G2 supplied to the gas flow path 45a via the gas flow path 42b toward the surface Wa. The discharge port 45b is provided on, for example, a lower end surface of the drying gas nozzle 45, and is opened on the lower end surface of the drying gas nozzle 45. A shape (contour) of the discharge port 45b may be circular when viewed from the discharge direction of the drying gas G2 (the Z-axis direction in the drawings).

Cooling Gas Nozzle

The cooling gas nozzle 46 (first gas nozzle) is configured to discharge the cooling gas G1 toward the surface Wa of the workpiece W. The cooling gas nozzle 46 discharges the cooling gas G1 radially to the surface Wa from above the surface Wa. For example, as shown in FIG. 6, the cooling gas nozzle 46 discharges the cooling gas G1 at a plurality of different angles with respect to the surface Wa when viewed from the X-axis direction. The cooling gas nozzle 46 may discharge the cooling gas G1 uniformly in a radial discharge range. On the other hand, the cooling gas nozzle 46 may discharge the cooling gas G1 in one direction inclined with respect to the surface Wa when viewed from the Y-axis direction.

In the example shown in FIGS. 5 and 6, the cooling gas nozzle 46 is fixed to the lower end of the horizontal portion 44a at a location below the horizontal portion 44a of the holding arm 44 in the vicinity of the vertical portion 44b. The cooling gas nozzle 46 is provided with a gas flow path 51 which is continuous with the gas flow path 42a through which the cooling gas G1 supplied from the supply mechanism 41A flows. The gas flow path 42a is opened at the lower end of the horizontal portion 44a of the holding arm 44. The gas flow path 51 is formed so as to be continuous with the opening at the lower end of the gas flow path 42a. Further, the cooling gas nozzle 46 has a discharge port 52 that discharges the cooling gas G1 flowing through the gas flow path 51 toward the surface Wa of the workpiece W. For example, the cooling gas nozzle 46 has a block-shaped main body 53 that forms the gas flow path 51 therein. A discharge port 52 is opened on at least one surface included in the main body 53.

The gas flow path 51 includes a supply flow path 55 located on the upstream side and a discharge flow path 56 located on the downstream side. In the present disclosure, the terms "upstream" and "downstream" are used with reference to a gas flow or a liquid flow. One end of the supply flow path 55 on the upstream side is connected to the gas flow path 42a provided inside the horizontal portion 44a of the holding arm 44, and the other end of the supply flow path 55 on the downstream side is connected to one end portion of the discharge flow path 56 on the upstream side. The discharge port 52 is provided at the other end of the discharge flow path 56 on the downstream side. The supply flow path 55 causes the cooling gas G1 to flow vertically downward, for example. The discharge flow path 56 causes the cooling gas G1 to flow along an extending direction of an inclined surface D0 inclined at a predetermined angle with respect to the surface Wa of the workpiece W, and then causes the cooling gas G1 to reach the discharge port 52. The discharge flow path 56 causes the cooling gas G1 to flow in one direction along the inclined surface D0, and then radially widens the flow direction of the cooling gas G1. Hereinafter, the one direction in which the cooling gas G1 flows before spreading radially in the discharge flow path 56 is referred to as "direction D1." The direction D1 extends along the inclined surface D0. For example, the direction D1 is inclined with respect to the surface Wa of the workpiece W when viewed from the Y-axis direction.

Figure 7A:
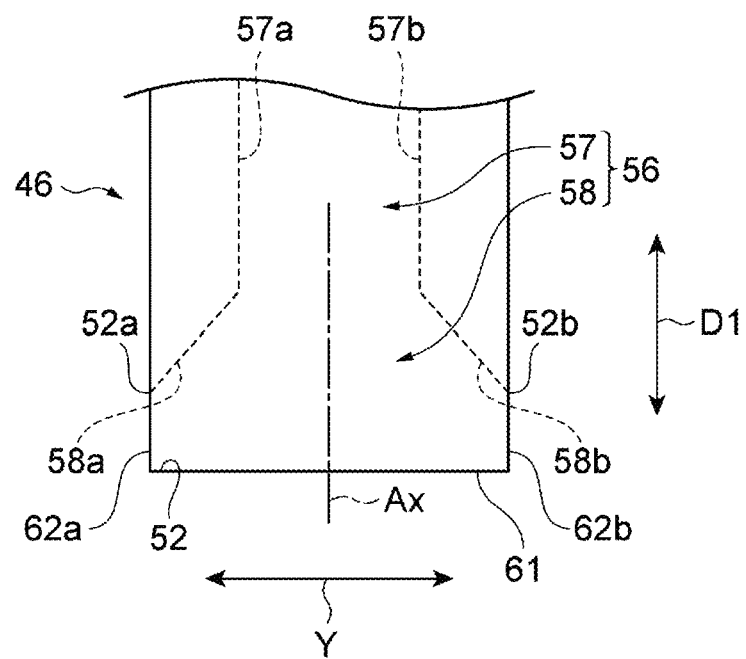
Figure 7B:
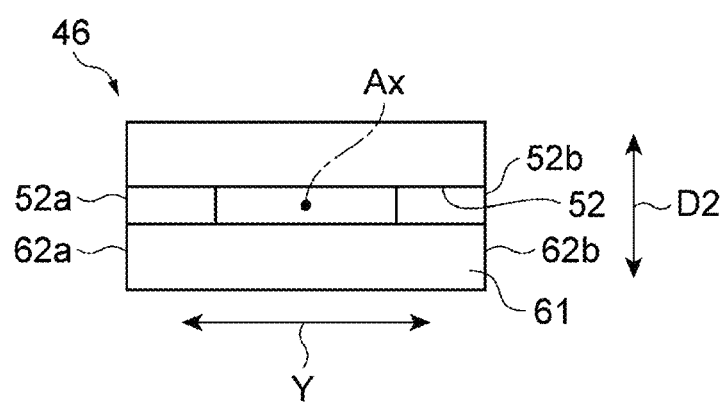

A shape of the nozzle (particularly, a shape of the gas flow path 51) for the cooling gas nozzle 46 to discharge the cooling gas G1 radially with respect to the surface Wa of the workpiece W will be described with reference to FIGS. 7A, 7B, and 7C. In FIGS. 7A, 7B, and 7C, an example of a tip end portion (a portion in the vicinity of the discharge port 52) of the cooling gas nozzle 46, in which the tip end portion is formed in a rectangular parallelepiped shape, is shown. Further, a front view, a bottom view, and a side view of the tip portion are shown in a state in which the direction D1 is aligned with a vertical direction of the drawing sheet surface or a direction perpendicular to the drawing sheet surface. Further, a direction orthogonal to the Y-axis direction and the direction D1 is referred to as direction D2 (see FIGS. 7B and 7C).

The discharge flow path 56 includes a first region 57 located on the upstream side and a second region 58 located on the downstream side. The first region 57 causes the cooling gas G1 supplied from the gas flow paths (the gas flow path 42b and the supply flow path 55 described above) disposed on the upstream side to flow along the direction D1. The first region 57 is composed of a pair of side surfaces 57a and 57b arranged to face each other, and a pair of wall surfaces 57c and 57d arranged to face each other. The side surfaces 57a and 57b are located at both ends in the Y-axis direction to extend along the directions D1 and D2, and are parallel to each other. The wall surfaces 57c and 57d extend along the Y-axis direction and the direction D1, and are parallel to each other. The wall surfaces 57c and 57d are arranged to face each other in the direction D2. The first region 57 is formed by the side surfaces 57a and 57b and the wall surfaces 57c and 57d. As an example, a cross-sectional shape of the first region 57 is a rectangle extending in the Y-axis direction as a longitudinal direction. A cross-sectional area of the first region 57 in the Y-axis direction is substantially constant regardless of the direction D1. In the first region 57 described above, the cooling gas G1 flows along the direction D1.

The second region 58 guides the cooling gas G1 supplied from the first region 57 to the discharge port 52. The second region 58 is formed so as to cause the cooling gas G1 flowing in the first region 57 along the direction D1 to radially spread in the Y-axis direction. The second region 58 is composed of a pair of inclined surfaces 58a and 58b arranged to face each other, and a pair of wall surfaces 58c and 58d arranged to face each other. The wall surfaces 58c and 58d are continuous with the wall surfaces 57c and 57d, respectively, and extend along the Y-axis direction and the direction D1. The wall surfaces 58c and 58d are parallel to each other. Therefore, a width of the second region 58 along the direction D2 is the same as that of the first region 57 (see FIG. 7C). The extending direction of the wall surfaces 57c and 57d and the wall surfaces 58c and 58d corresponds to the extending direction of the inclined surface D0.

The inclined surfaces 58a and 58b are provided at both ends of the second region 58 in the Y-axis direction. One ends of the inclined surfaces 58a and 58b on the upstream side are connected to the side surfaces 57a and 57b, respectively, and one ends of each of the inclined surfaces 58a and 58b on the downstream side are connected to the discharge port 52 (both ends of the discharge port 52 in the Y-axis direction).

Each of the inclined surfaces 58a and 58b is inclined with respect to the direction D1. Specifically, the inclined surface 58a is inclined outward with respect to the direction D1 so that a distance from the inclined surface 58b increases as the inclined surface 58a approaches the discharge port 52. The inclined surface 58b is inclined outward with respect to the direction D1 so that a distance from the inclined surface 58a increases as the inclined surface 58b approaches the discharge port 52. Each of the inclined surfaces 58a and 58b is inclined in such a direction as to move away from an axis Ax of the cooling gas nozzle 46 (outward) as it extends from a connection portion with the side surface 57a or 57b toward the discharge port 52. The axis Ax of the cooling gas nozzle 46 is a virtual axis extending along the direction D1 and passing through the center of the discharge port 52 when viewed from the direction D1. As described above, at least the inclined surfaces 58a and 58b of the second region 58 are formed in a reverse taper shape in which the distance between the inclined surfaces 58a and 58b is widened toward the discharge port 52. As a result, the width of the second region 58 (discharge flow path 56) in the Y-axis direction increases as the second region 58 approaches the discharge port 52, so that the cooling gas G1 from the discharge port 52 is discharged radially in the Y-axis direction. Inclination angles of the inclined surfaces 58a and 58b (inclination angles with respect to the direction D1) may be substantially the same.

The discharge port 52 of the cooling gas nozzle 46 is formed so as to extend in one direction along the surface Wa. In the present disclosure, a shape extending in one direction means a shape in which a width in one direction is larger than a width in a direction orthogonal to the one direction. In one example, the discharge port 52 has a shape in which one direction is a longitudinal direction (long-axis direction) and a direction orthogonal to the one direction is a transverse direction (short-axis direction). Specifically, the discharge port 52 has a rectangular shape, a rounded-corner rectangular shape having rounded longitudinal end portions, an elliptical shape, or a shape similar thereto. For example, as shown in FIGS. 7A to 7C, the discharge port 52 has a shape extending in the Y-axis direction (first direction). In the example shown in FIGS. 7A to 7C, the discharge port 52 is a rectangular slit extending at least in the Y-axis direction. As an example, a ratio of a length of the discharge port 52 in one direction (Y-axis direction) to a length of the discharge port 52 in the direction orthogonal to the one direction (in the direction D2 orthogonal to the Y-axis direction in FIG. 7B) is 100:1 to 10:1. As described above, the cooling gas G1 is fed to the discharge port 52 from the discharge flow path 56.

In the cooling gas nozzle 46 illustrated in FIGS. 7A to 7C, the discharge port 52 is formed to be visually recognizable when viewed from the direction D1 (when viewed from the downstream to the upstream of the flow of the gas flowing in the direction D1). For example, as shown in FIGS. 7B and 7C, the main body 53 of the cooling gas nozzle 46 may be provided with a bottom surface 61 facing the surface Wa of the workpiece W. In this case, the discharge port 52 is provided on the bottom surface 61. The discharge port 52 is formed so as to extend from one end to the other end of the bottom surface 61 in the Y-axis direction when viewed from the direction D1.

The discharge port 52 may be formed so that each of both ends of the discharge port 52 in the Y-axis direction can be visually recognized when viewed from the Y-axis direction. More specifically, the discharge port 52 is formed so that portions 52a and 52b of the discharge port 52 connected to the inclined surfaces 58a and 58b of the discharge flow path 56 (second region 58), respectively, can be visually recognized when viewed from the Y-axis direction. The fact that the portions 52a and 52b can be visually recognized when viewed from the Y-axis direction means that the portion 52a can be visually recognized from one side in the Y-axis direction and the portion 52b can be visually recognized from the other side in the Y-axis direction.

In the example shown in FIGS. 7A to 7C, a surface (hereinafter referred to as "opening surface") including an opening edge of the discharge port 52 includes an opening bottom surface orthogonal to the direction D1 and a pair of opening side surfaces connected to the opening bottom surface and facing each other in the Y-axis direction. The opening edge of the discharge port 52 is a ridge line that connects an outer surface of the main body 53 and the discharge port 52 (the end portion of the discharge flow path 56). The opening surface is a virtual surface including the entire ridge line. The discharge port 52 of the cooling gas nozzle 46 is opened not only on the bottom surface 61 described above, but also on side surfaces 62a and 62b connected to the bottom surface 61 and arranged opposite to each other in the Y-axis direction. In this case, a portion of the discharge flow path 56 on the downstream side of the inclined surfaces 58a and 58b penetrates the main body 53 in the Y-axis direction. For example, on each of the side surfaces 62a and 62b, the discharge port 52 is formed so as to extend along the direction D1 from the connection portion with the bottom surface 61.

With the configuration described above, the cooling gas G1 flowing through the gas flow path 51 of the cooling gas nozzle 46 is radially discharged from the discharge port 52 via the first region 57 and the second region 58 of the discharge flow path 56. As a result, the cooling gas G1 is discharged from above the surface Wa to the surface Wa. As an example, as shown in FIG. 6, the cooling gas nozzle 46 discharges the cooling gas G1 in directions specified by a plurality of angles falling within a predetermined angle range (e.g., −45 degrees to +45 degrees) with respect to the axis Ax.

In addition, the shape of the discharge port 52 of the cooling gas nozzle 46 is not limited to the above example. The opening surface including the opening edge of the discharge port 52 may be formed so that a central portion of the opening surface in the Y-axis direction protrudes toward the surface Wa. More specifically, the central portion of the opening surface in the Y-axis direction may protrude toward the surface Wa further than both ends of the opening surface in the Y-axis direction. Also in this case, each of both ends of the discharge port 52 in the Y-axis direction can be visually recognized when viewed from the Y-axis direction.

Figure 8A:
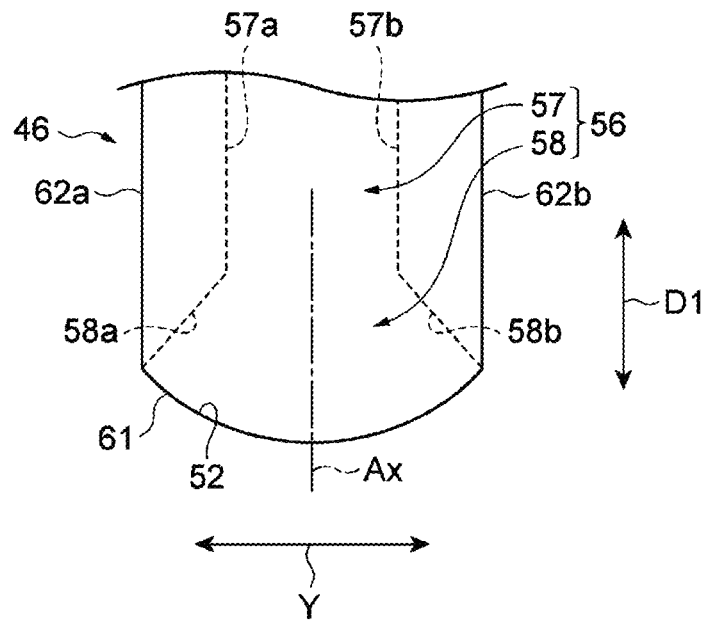
Figure 8B:
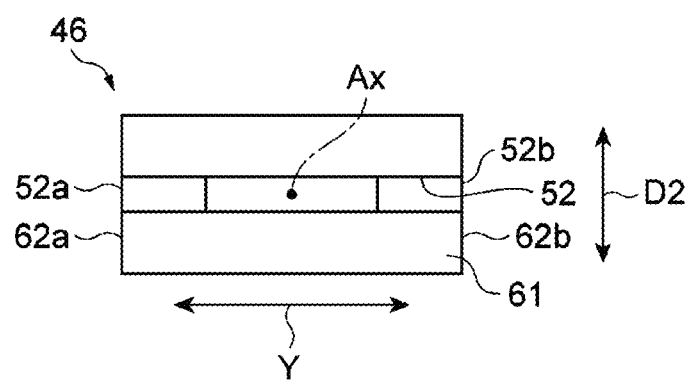

For example, as shown in FIGS. 8A to 8C, the bottom surface 61 of the main body 53 is curved so that the central portion of the bottom surface 61 in the Y-axis direction protrudes from the ends of the inclined surfaces 58a and 58b of the second region 58 toward the surface Wa. In this example, the opening surface of the discharge port 52 including the opening edge is curved so that the central portion of the opening surface in the Y-axis direction protrudes toward the surface Wa. One end of the bottom surface 61 in the Y-axis direction (the portion 52a of the discharge port 52) is connected to the inclined surface 58a, and the other end of the bottom surface 61 in the Y-axis direction (the portion 52b of the discharge port 52) is connected to the inclined surface 58b. Also in this case, the portions 52a and 52b of the discharge port 52 connected to the inclined surfaces 58a and 58b, respectively, can be visually recognized when viewed from the Y-axis direction. The portion of the discharge flow path 56 on the downstream side of the inclined surfaces 58a and 58b penetrates the main body 53 in the Y-axis direction. The opening surface (the bottom surface 61 of the main body 53) may be formed in a trapezoidal shape rather than the curved shape when viewed from the X-axis direction. Even in the trapezoidal shape, the central portion (a portion corresponding to the raised bottom) of the opening surface in the Y-axis direction protrudes toward the surface Wa further than both ends of the opening surface in the Y-axis direction.

Figure 9A:
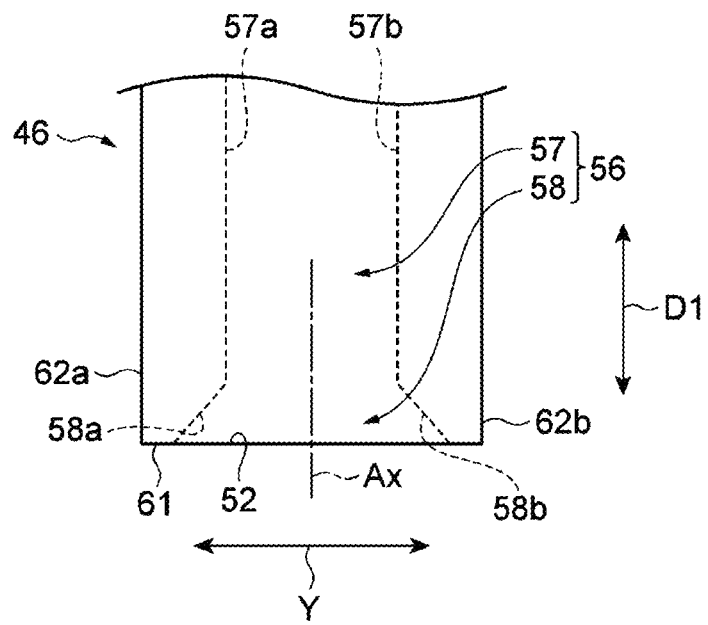
FIGS. 9A to 9C are schematic diagrams showing another example of the gas nozzle.
Figure 9B:
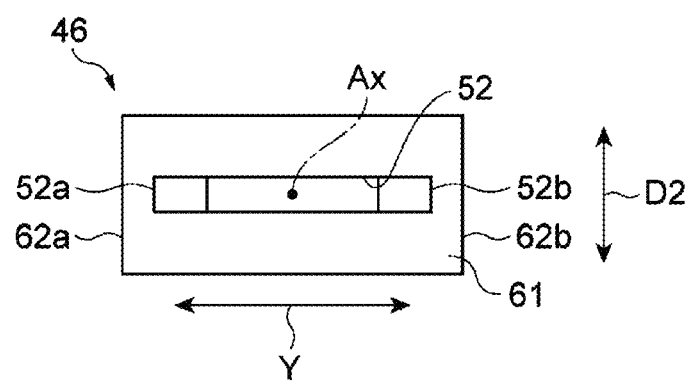
Figure 9C:
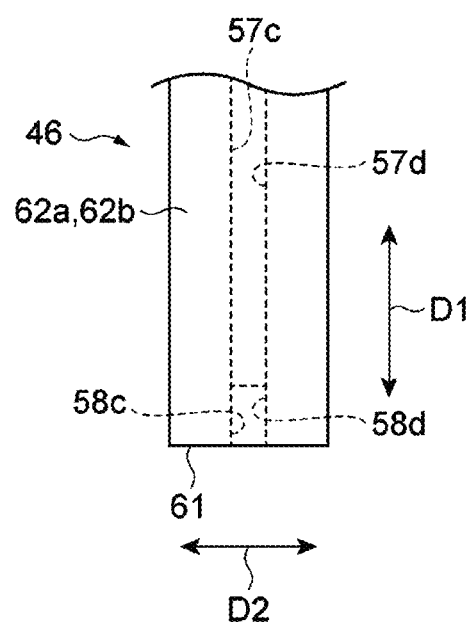

The discharge port 52 may be formed so that both ends of the discharge port 52 in the Y-axis direction cannot be visually recognized from any side in the Y-axis direction. For example, as shown in FIGS. 9A to 9C, the discharge port 52 may be opened on the bottom surface 61 and may not be opened on the side surfaces 62a and 62b connected to the bottom surface 61. The portions (portions 52a and 52b) of the discharge port 52 connected to the inclined surfaces 58a, 58b cannot be visually recognized when viewed from the Y-axis direction, but can be visually recognized when viewed from the direction D1. In this case, a distance between both ends of the discharge port 52 in the Y-axis direction is smaller than a distance of the bottom surface 61 in the Y-axis direction. The width of the discharge port 52 shown in FIGS. 8A to 8C (the discharge port 52 having the curved opening surface) in the Y-axis direction may be smaller than a length of the curved bottom surface 61 in the Y-axis direction.

In any of the examples of FIGS. 7A to 9C, the discharge port 52 and the discharge flow path 56 (three-dimensional shapes thereof) are plane-symmetric with respect to a vertical plane (X-Z plane) passing through the axis Ax and perpendicular to the extending direction of the discharge port 52. The cooling gas G1 discharged from the cooling gas nozzle 46 having the discharge port 52 and the discharge flow path 56 is discharged so as to spread from the axis Ax toward both sides in the Y-axis direction. As a result, the cooling gas G1 is radially discharged from the cooling gas nozzle 46 (the discharge port 52). The cooling gas G1 reaches a region extending in the Y-axis direction on the surface Wa of the workpiece W.

Since the cooling gas G1 is discharged radially, as shown in FIG. 6, a width of a region on the surface Wa at which the cooling gas G1 reaches (hereinafter referred to as "arrival region AR") in the Y-axis direction is larger than the width of the discharge port 52 in the Y-axis direction. In the Y-axis direction, a distance between one end of the arrival region AR and the axis Ax is larger than a distance between one end of the discharge port 52 and the axis Ax, and a distance between the other end of the arrival region AR and the axis Ax is larger than a distance between the other end of the discharge port 52 and the axis Ax. The width of the arrival region AR in the Y-axis direction is approximately equal to the distance between a point where a virtual line ILa extending along the inclined surface 58a intersects the surface Wa and a point where a virtual line ILb extending along the inclined surface 58b intersects the surface Wa. The width of the arrival region AR in the Y-axis direction may be smaller than a radius of the circular workpiece W. In one example, the width of the arrival region AR in the Y-axis direction may be 0.4 to 0.8 times, 0.5 to 0.7 times, or 0.55 to 0.65 times as large as the radius of the workpiece W.

Returning to FIG. 5, the drying gas nozzle 45 and the cooling gas nozzle 46 are connected to each other via the holding arm 44. Therefore, when the holding arm 44 moves, the drying gas nozzle 45 and the cooling gas nozzle 46 are moved together. As shown in FIG. 5, the drying gas nozzle 45 and the cooling gas nozzle 46 are arranged at different positions in the X-axis direction (second direction). The drying gas nozzle 45 and the cooling gas nozzle 46 are configured so that when viewed from the Y-axis direction, a distance in the X-axis direction between an arrival position of the drying gas G2 from the drying gas nozzle 45 on the surface Wa of the workpiece W and an arrival position (arrival region AR) of the cooling gas G1 from the cooling gas nozzle 46 on the surface Wa becomes smaller than a distance in the X-axis direction between the discharge port 45b of the drying gas nozzle 45 and the discharge port 52 of the cooling gas nozzle 46.

In one example, when viewed from the Y-axis direction, a virtual line IL1 extending in the discharge direction of the cooling gas G1 discharged from the cooling gas nozzle 46 and a virtual line IL2 extending in the discharge direction of the drying gas G2 discharged from the drying gas nozzle 45 intersect each other in the vicinity of the surface Wa (e.g., on the surface Wa). As a result, if it is assumed that the drying gas G2 and the cooling gas G1 are discharged from the drying gas nozzle 45 and the cooling gas nozzle 46, respectively, when the nozzle unit 43 is located at a fixed position, the arrival region (arrival position) of the drying gas G2 on the surface Wa and the arrival region AR of the cooling gas G1 from the cooling gas nozzle 46 on the surface Wa overlap each other when viewed from the Y-axis direction.

As shown in FIG. 6, the drying gas nozzle 45 is arranged so as to overlap the cooling gas nozzle 46 when viewed from the X-axis direction. For example, the position of the drying gas nozzle 45 in the Y-axis direction substantially coincides with the position of the center (axis Ax) of the cooling gas nozzle 46 in the Y-axis direction. In this case, when viewed from the X-axis direction, the arrival region (arrival position) of the drying gas G2 from the drying gas nozzle 45 on the surface Wa approximately coincides with the position of the center of the arrival region AR of the cooling gas G1 from the cooling gas nozzle 46 on the surface Wa. The position of the drying gas nozzle 45 in the Y-axis direction may be different from the position of the center (axis Ax) of the cooling gas nozzle 46 in the Y-axis direction. In this case, when viewed from the X-axis direction, the arrival region (arrival position) of the drying gas G2 from the drying gas nozzle 45 on the surface Wa is shifted from the position of the center of the arrival region AR of the cooling gas G1 from the cooling gas nozzle 46 of the surface Wa.

The cooling gas nozzle 46 and the drying gas nozzle 45 may be configured so that a flow velocity of the cooling gas G1 discharged from the discharge port 52 of the cooling gas nozzle 46 becomes smaller than a flow velocity of the drying gas G2 discharged from the discharge port 45b of the drying gas nozzle 45. For example, the cooling gas nozzle 46 and the drying gas nozzle 45 are respectively configured so that gases having substantially the same flow rate (flow rate per unit time) are supplied to the cooling gas nozzle 46 and the drying gas nozzle 45, respectively, and the opening area of the discharge port 52 becomes larger than the opening area of the discharge port 45b. Alternatively, the supply mechanisms 41A and 41B are controlled by the control device 100 so that the flow rate of the cooling gas G1 supplied from the supply mechanism 41A to the cooling gas nozzle 46 becomes smaller than the flow rate of the drying gas G2 supplied from the supply mechanism 41B to the drying gas nozzle 45.

The cooling gas nozzle 46 and the drying gas nozzle 45 may be arranged so that the cooling gas G1 can be easily diffused after being discharged. For example, the cooling gas nozzle 46 and the drying gas nozzle 45 may be arranged so that when viewed from the extension direction of the discharge port 52, a distance between the discharge port 52 extending along the discharge direction of the cooling gas G1 (along the virtual line IL1 in FIG. 5) and the surface Wa becomes longer than a distance between the discharge port 45b extending along the discharge direction of the drying gas G2 (along the virtual line IL2 in FIG. 5) and the surface Wa. Even when gases are supplied from two types of gas nozzles having different purposes at substantially the same flow rate (flow rate per unit time), depending on the configuration (arrangement) of the two gas nozzles, a gas pressure applied to the surface Wa (more specifically, a liquid surface of the treatment liquid on the surface Wa) may be adjusted to a level suitable for the processing purpose. Specifically, when the cooling gas G1 is supplied, the distance between the nozzle and the surface is increased, whereby the pressure due to the cooling gas G1 can be reduced to the extent that the liquid surface of the treatment liquid is not disturbed or the treatment liquid is not blown off, so that the surface Wa of the workpiece W is not exposed. On the other hand, when the drying gas G2 is supplied, the distance between the nozzle and the surface is reduced, whereby the pressure due to the drying gas G2 can be increased to the extent that a flow of the treatment liquid is created or the treatment liquid is blown off, so as to form a dry region D (details of which will be described later) in which the surface Wa of the workpiece W is exposed.

When the same type of gas is used for the cooling gas G1 and the drying gas G2, a common gas source may be used. Specifically, one flow path connected to one gas source may be branched into two flow paths. Each of the two flow paths may be provided with a valve having an opening and closing state that can be switched by the control device 100. One flow path may be connected to the gas flow path 42a that guides the cooling gas G1 to the discharge port 52 of the cooling gas nozzle 46. The other flow path may be connected to the gas flow path 42b that guides the drying gas G2 to the discharge port 45b of the drying gas nozzle 45.

Treatment Liquid Nozzle

The treatment liquid nozzle 47 is configured to discharge the treatment liquid L2 toward the surface Wa of the workpiece W. For example, the treatment liquid nozzle 47 discharges the treatment liquid L2 from above the surface Wa toward the surface Wa in a direction different from the vertical direction. For example, when viewed from the Y-axis direction, the discharge direction of the treatment liquid L2 from the treatment liquid nozzle 47 is inclined with respect to the surface Wa, and when viewed from the X-axis direction, the discharge direction is substantially perpendicular to the surface Wa.

In the example shown in FIG. 5, the treatment liquid nozzle 47 is connected to the holding arm 44 via a holder 48. The holder 48 is connected to the side surface of the vertical portion 44b of the holding arm 44. The holder 48 holds the treatment liquid nozzle 47 on a bottom surface thereof that is closest to the direction extending along the surface Wa. The treatment liquid flow path 42c for causing the treatment liquid L2 supplied from the supply mechanism 41C to flow therethrough is connected to the treatment liquid nozzle 47. The treatment liquid flow path 42c may be provided, for example, inside the horizontal portion 44a of the holding arm 44, outside the holding arm 44, and inside the holder 48. When the treatment liquid flow path 42c is provided outside the holding arm 44, a coating material or the like for covering the treatment liquid flow path 42c may be provided. The treatment liquid nozzle 47 is provided with a treatment liquid flow path 47a extending along a discharge direction of the treatment liquid L2. The treatment liquid flow path 47a is continuous from an end of the treatment liquid flow path 42c provided in the holder 48. Further, the treatment liquid nozzle 47 includes a discharge port 47b (third discharge port) for discharging the treatment liquid L2 supplied via the treatment liquid flow path 47a toward the surface Wa. The discharge port 47b is provided on, for example, a lower end surface of the treatment liquid nozzle 47, and is opened at the lower end surface of the treatment liquid nozzle 47. A shape (contour) of the discharge port 47b may be circular when viewed from the discharge direction of the treatment liquid L2.

The treatment liquid nozzle 47 and the cooling gas nozzle 46 are connected to each other via the holding arm 44 and the holder 48. Therefore, when the holding arm 44 is moved, the treatment liquid nozzle 47 and the cooling gas nozzle 46 are moved together. In the present embodiment, the drying gas nozzle 45, the cooling gas nozzle 46, and the treatment liquid nozzle 47 are connected to one another via the holding arm 44 and the like. Therefore, these three nozzles are moved together along with the movement of the holding arm 44. As shown in FIG. 5, the cooling gas nozzle 46, the drying gas nozzle 45, and the treatment liquid nozzle 47 are arranged at different positions in the X-axis direction. For example, the cooling gas nozzle 46, the drying gas nozzle 45, and the treatment liquid nozzle 47 are arranged in this order when viewed from the Y-axis direction.

The treatment liquid nozzle 47 and the cooling gas nozzle 46 are configured so that when viewed from the Y-axis direction, a distance in the X-axis direction between an arrival position of the treatment liquid L2 from the treatment liquid nozzle 47 on the surface Wa of the workpiece W and the arrival position (arrival region AR) of the cooling gas G1 from the cooling gas nozzle 46 on the surface Wa becomes smaller than a distance in the X-axis direction between the discharge port 47b of the treatment liquid nozzle 47 and the discharge port 52 of the cooling gas nozzle 46. The same relationship for the arrival positions and the discharge ports is established between the treatment liquid nozzle 47 and the drying gas nozzle 45.

In one example, when viewed from the Y-axis direction, a virtual line IL3 extending in the discharge direction of the treatment liquid L2 discharged from the treatment liquid nozzle 47 and the virtual line IL1 extending in the discharge direction of the cooling gas G1 discharged from the cooling gas nozzle 46 intersect each other in the vicinity of the surface Wa (e.g., on the surface Wa). As a result, when the nozzle unit 43 is located at a fixed position, an arrival region (arrival position) of the treatment liquid L2 discharged from the treatment liquid nozzle 47 and the arrival region AR of the cooling gas G1 discharged from the cooling gas nozzle 46 on the surface Wa may overlap each other when viewed from the Y-axis direction. In the present embodiment, the nozzle unit 43 is configured so that when viewed from the Y-axis direction, in addition to the virtual lines IL1 and IL3, the virtual line IL2 extending in the discharge direction of the drying gas G2 discharged from the drying gas nozzle 45 also intersects at a point on the surface Wa.

The drying gas nozzle 45 and the treatment liquid nozzle 47 are configured so that when viewed from the Y-axis direction, an inclination of the discharge direction of the treatment liquid L2 discharged from the treatment liquid nozzle 47 with respect to the surface Wa becomes smaller than an inclination of the discharge direction of the drying gas G2 discharged from the drying gas nozzle 45 with respect to the surface Wa. For example, when viewed from the Y-axis direction, an angle between the virtual line IL3 extending in the discharge direction of the treatment liquid L2 and the surface Wa (an angle of 90 degrees or less) is smaller than an angle between the virtual line IL2 extending in the discharge direction of the drying gas G2 and the surface Wa (an angle of 90 degrees or less). The same magnitude relationship is also established for an inclination of the discharge direction of the drying gas G2 and the discharge direction of the cooling gas G1 discharged from the cooling gas nozzle 46 with respect to the surface Wa.

As shown in FIG. 6, the treatment liquid nozzle 47 and the drying gas nozzle 45 may be arranged at substantially the same position in the Y-axis direction. When viewed from the X-axis direction, the arrival region (arrival position) of the treatment liquid L2 discharged from the treatment liquid nozzle 47 on the surface Wa and the arrival region (arrival position) of the drying gas G2 discharged from the drying gas nozzle 45 on the surface Wa may be approximately the same. Unlike the example shown in FIG. 6, the treatment liquid nozzle 47 and the drying gas nozzle 45 may be arranged at different positions in the Y-axis direction. When viewed from the X-axis direction, the arrival region (arrival position) of the treatment liquid L2 discharged from the treatment liquid nozzle 47 on the surface Wa and the arrival region (arrival position) of the drying gas G2 discharged from the drying gas nozzle 45 on the surface Wa may be may be different from each other.

Similar to the drying gas nozzle 45, the treatment liquid nozzle 47 may be arranged so as to overlap the cooling gas nozzle 46 when viewed from the X-axis direction. For example, the position of the treatment liquid nozzle 47 in the Y-axis direction substantially coincides with the position of the center (axis Ax) of the cooling gas nozzle 46 in the Y-axis direction. In this case, when viewed from the X-axis direction, the arrival region (arrival position) of the treatment liquid L2 discharged from the treatment liquid nozzle 47 on the surface Wa substantially coincides with the position of the center of the arrival region AR of the cooling gas G1 discharged from the cooling gas nozzle 46 on the surface Wa. Alternatively, the position of the treatment liquid nozzle 47 in the Y-axis direction may be different from the position of the center (axis Ax) of the cooling gas nozzle 46 in the Y-axis direction. In this case, when viewed from the X-axis direction, the arrival region (arrival position) of the treatment liquid L2 discharged from the treatment liquid nozzle 47 on the surface Wa is shifted from the position of the center of the arrival region AR of the cooling gas G1 discharged from the cooling gas nozzle 46 on the surface Wa.

A distance (shortest distance) in the Z-axis direction between the discharge port 45b of the drying gas nozzle 45 and the surface Wa may be larger than a distance (shortest distance) in the Z-axis direction between the discharge port 47b of the treatment liquid nozzle 47 and the surface Wa. The distance (shortest distance) in the Z-axis direction between the discharge port 45b and the surface Wa may be larger than a distance (shortest distance) in the Z-axis direction between the discharge port 52 of the cooling gas nozzle 46 and the surface Wa. The arrangement relationship of the three nozzles described above is nothing more than an example, and the three nozzles may be arranged in any way.

Drive Part

The drive part 49 is configured to move the holding arm 44 in the height direction and the horizontal direction (the direction extending along the surface Wa of the workpiece W) based on a signal from the control device 100. The drive part 49 is connected to, for example, the base end portion of the horizontal portion 44a of the holding arm 44 as described above. The drive part 49 may include a linear actuator configured to displace the holding arm 44 in the direction in which the discharge port 52 of the cooling gas nozzle 46 extends (in the Y-axis direction), and an elevating actuator configured to displace the holding arm 44 in the Z-axis direction. The drive part 49 may not include a linear actuator configured to displace the holding arm 44 in the X-axis direction.

The drying gas nozzle 45, the cooling gas nozzle 46, and the treatment liquid nozzle 47 are moved together along with the displacement of the holding arm 44 by the drive part 49. In one example, the drive part 49 displaces the holding arm 44 horizontally (in the Y-axis direction) so that the extension direction of the arrival region AR (the expected arrival region) of the cooling gas G1 discharged from the cooling gas nozzle 46 extends along the radial direction of the workpiece W held by the substrate holder 20. In this case, the arrival position (the expected arrival position) of the drying gas G2 discharged from the drying gas nozzle 45 and the arrival position (the expected arrival position) of the treatment liquid L2 discharged from the treatment liquid nozzle 47 are also displaced in the radial direction of the workpiece W.

Cover

Returning to FIG. 4, the cover 70 is provided around the substrate holder 20. The cover 70 includes a cup main body 71, a drain port 72, and an exhaust port 73. The cup main body 71 is configured as a liquid collection container for receiving the treatment liquids L1 and L2 supplied to the workpiece W for the treatment of the workpiece W. The drain port 72 is provided at the bottom of the cup main body 71, and is configured to drain the liquid collected by the cup main body 71 to the outside of the liquid treatment unit U1.

The exhaust port 73 is provided at the bottom of the cup main body 71. In the exhaust port 73, there is provided an exhauster V2 configured to exhaust a gas in the cup main body 71 by operating based on a signal from the control device 100. Therefore, a descending flow (down-flow) flowing around the workpiece W is discharged to the outside of the liquid treatment unit U1 via the exhaust port 73 and the exhauster V2. The exhauster V2 may be, for example, a damper capable of adjusting an exhaust amount of a gas according to an opening degree thereof. By adjusting the exhaust amount of the gas from the cup main body 71 with the exhauster V2, it is possible to control a temperature, pressure, humidity and the like in the cup main body 71.

The blower B is arranged above the substrate holder 20 and the cover 70 in the liquid treatment unit U1. The blower B is configured to form a down-flow toward the cover 70 based on a signal from the control device 100. The blower B may be controlled to continuously form the down-flow during the liquid treatment for the workpiece W.

Control Device

Figure 10:
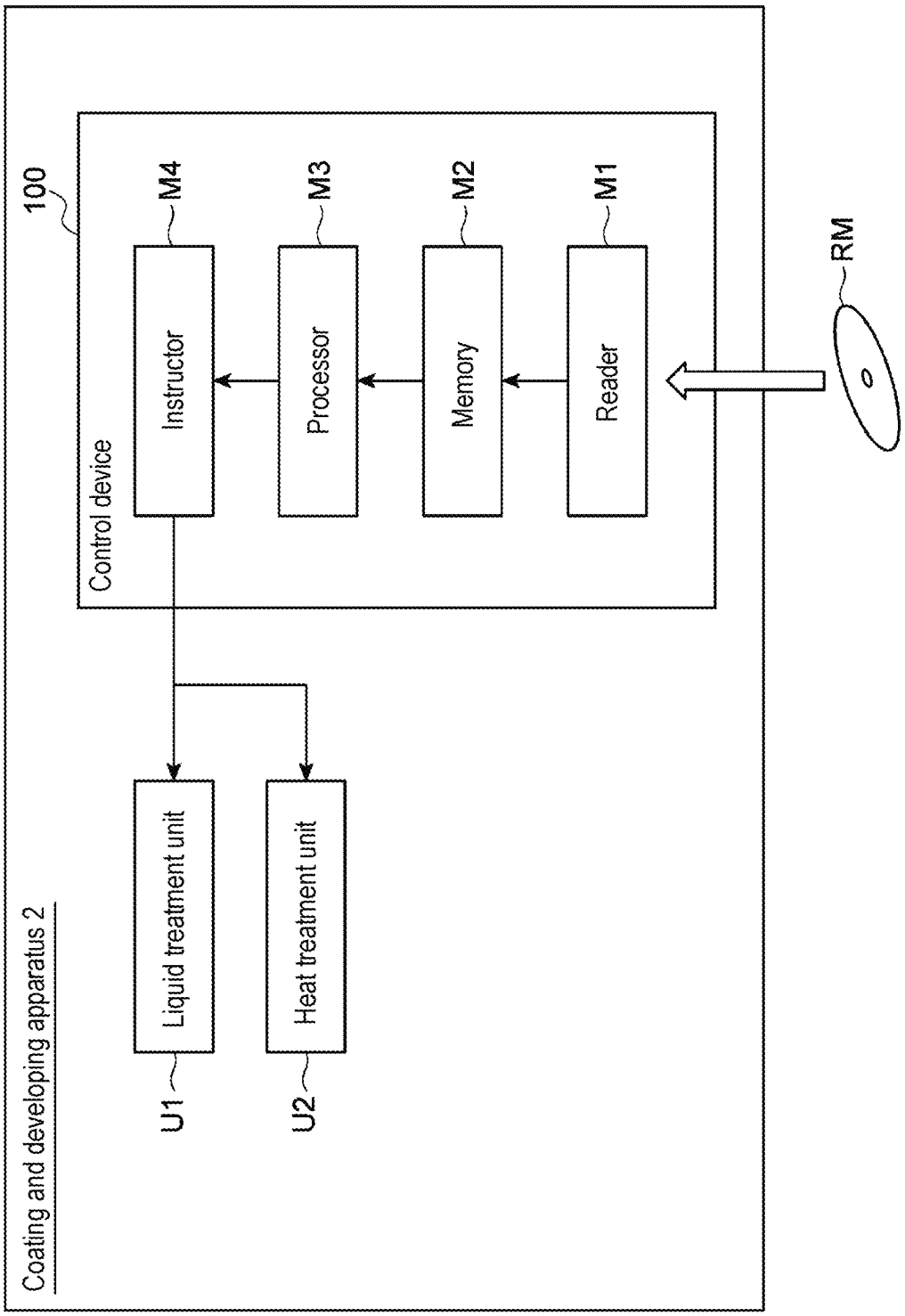
FIG. 10 is a block diagram showing an example of a functional configuration of a controller.

The control device 100 is configured to partially or wholly control components of the coating and developing apparatus 2. The control device 100 controls the liquid treatment unit U1 including at least the nozzle unit 43 and the substrate holder 20. As shown in FIG. 10, the control device 100 includes a reader M1, a memory M2, a processor M3, and an instructor M4 as functional modules. These functional modules are obtained by merely dividing functions of the control device 100 into a plurality of modules for the sake of convenience. This does not necessarily mean that hardware constituting the control device 100 is divided into such modules. The respective functional modules are not limited to ones realized by executing a program, but may be realized by a dedicated electric circuit (e.g., a logical circuit) or an integrated circuit (ASIC: Application Specific Integrated Circuit) that integrates dedicated electric circuits.

The reader M1 is configured to read a program from a non-transitory computer-readable recording medium RM. The recording medium RM records a program for operating the respective components of the coating and developing apparatus 2. The recording medium RM may be, for example, a semiconductor memory, an optical recording disk, a magnetic recording disk, or an optical magnetic recording disk.

The memory M2 is configured to store various data. The memory M2 may store, for example, a program read from the recording medium RM by the reader M1, setting data input from an operator via an external input device (not shown), and the like. The program may be configured to operate the respective components of the coating and developing apparatus 2.

The processor M3 is configured to process various data. For example, the processor M3 may generate signals for operating the liquid treatment unit U1, the heat treatment unit U2 and the like, based on various data stored in the memory M2.

The instructor M4 is configured to transmit the operation signals generated by the processor M3 to various apparatuses.

Figure 11:
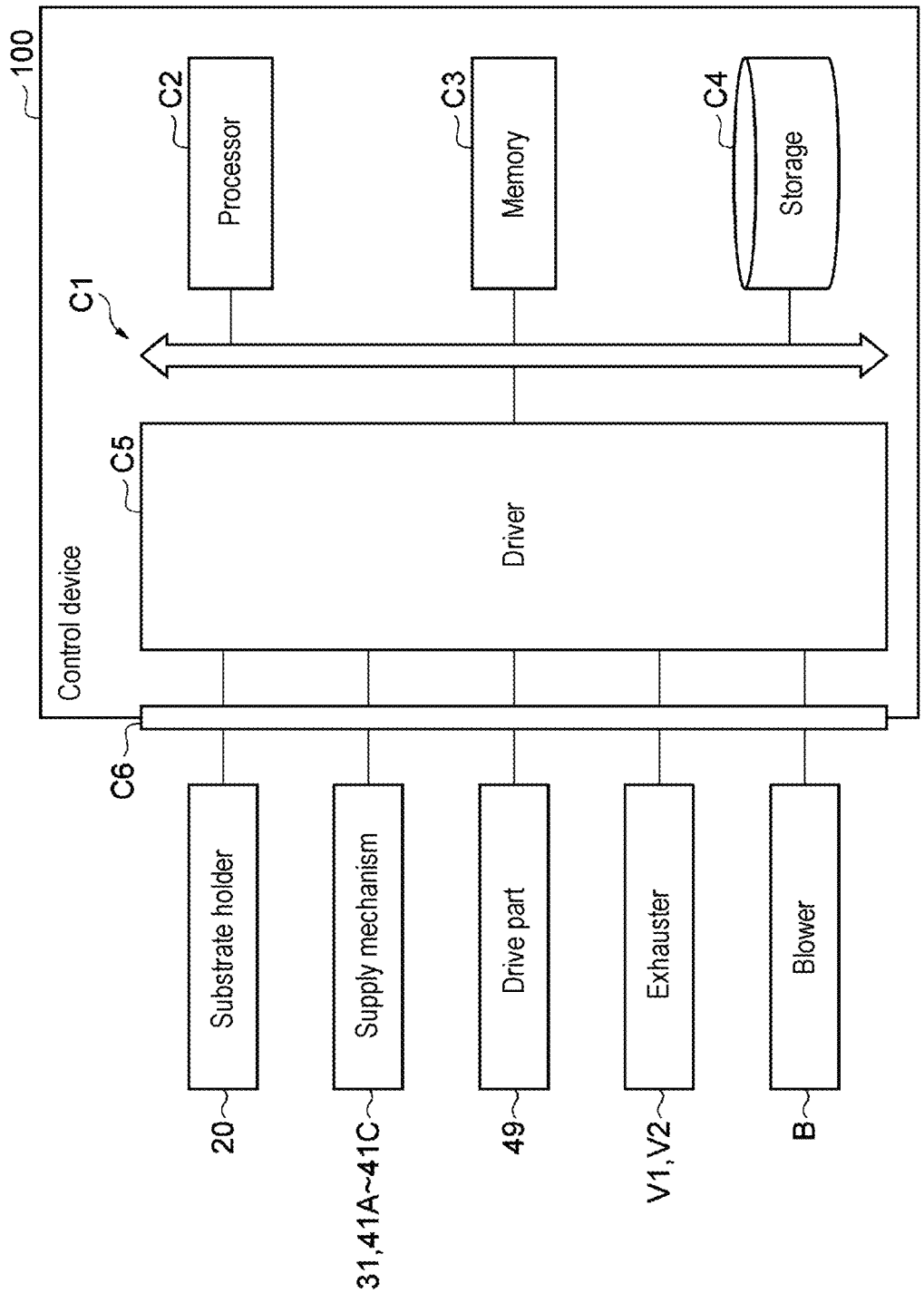
FIG. 11 is a block diagram showing an example of a hardware configuration of the controller.

The hardware of the control device 100 may be composed of, for example, one or more control computers. As shown in FIG. 11, the control device 100 includes a circuit C1 as a hardware configuration. The circuit C1 may be composed of an electric circuit element (circuitry). The circuit C1 may include a processor C2, a memory C3, a storage C4, a driver C5, and an input and output port C6.

The processor C2 constitutes each of the above-described functional modules by executing a program in cooperation with at least one of the memory C3 and the storage C4 and by executing input and output of a signal via the input and output port C6. The memory C3 and the storage C4 function as the memory M2. The driver C5 is a circuit for driving various devices of the coating and developing apparatus 2. The input and output port C6 performs input and output of signals between the driver C5 and various devices (e.g., the liquid treatment unit U1, the heat treatment unit U2, etc.) of the coating and developing apparatus 2.

The coating and developing apparatus 2 may include one control device 100, or may include a controller group (control unit) composed of a plurality of control devices 100. When the coating and developing apparatus 2 includes the controller group, each of the above functional modules may be realized by one control device 100, or may be realized by a combination of two or more control devices 100. When the control device 100 is composed of a plurality of computers (circuits C1), each of the above functional modules may be realized by one computer (circuit C1), or may be realized by a combination of two or more computers (circuits C1). The control device 100 may include a plurality of processors C2. In this case, each of the above functional modules may be realized by one processor C2, or may be realized by a combination of two or more processors C2.

Substrate Processing Method

Next, a liquid treatment method for the workpiece W as an example of a substrate processing method will be described with reference to FIGS. 12 to 15B. FIG. 12 is a flowchart showing an example of the liquid treatment method.

First, the control device 100 controls respective components of the coating and developing apparatus 2 to process the workpiece W in the processing modules PM1 to PM3, whereby the coating and developing apparatus 2 is caused to form the resist film R on the surface Wa of the workpiece W (step S11). Subsequently, the control device 100 controls the respective components of the coating and developing apparatus 2 to cause the transfer arm A7 or the like to transfer the workpiece W from the processing module PM3 to the exposure apparatus 3. Subsequently, another control device different from the control device 100 controls the exposure apparatus 3 to cause the exposure apparatus 3 to expose the resist film R formed on the surface Wa of the workpiece W in a predetermined pattern (step S12).

Subsequently, the control device 100 controls the respective components of the coating and developing apparatus 2 to cause the transfer arm A5 or the like to transfer the workpiece W from the exposure apparatus 3 to the liquid treatment unit U1 of the processing module PM4. As a result, the workpiece W is held by the substrate holder 20 with the surface Wa thereof facing upward. Subsequently, the control device 100 controls the supply 30 to cause the supply 30 to supply the treatment liquid L1 (developing liquid) to the surface Wa of the workpiece W, i.e., the upper surface of the resist film R (step S13).

Figure 13A:
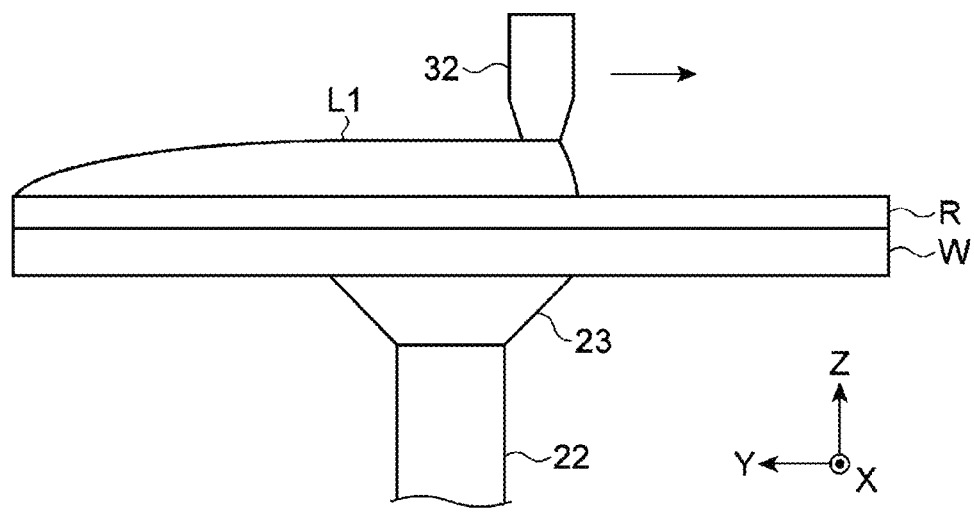
FIGS. 13A and 13B are schematic views for explaining an example of the liquid treatment method.

In step S13, the control device 100 may control the supply 30 to cause the supply 30 to supply the treatment liquid L1 from the nozzle 33 toward the surface Wa of the workpiece W while horizontally moving the nozzle 33 above the non-rotating workpiece W. In this case, as illustrated in FIG. 13A, the treatment liquid L1 is sequentially supplied from one end to the other end of the workpiece W. Alternatively, the control device 100 may control the substrate holder 20 and the supply 30 to cause the supply 30 to supply the treatment liquid L1 from the nozzle 33 toward the surface Wa of the workpiece W while rotating the workpiece W by the substrate holder 20 and horizontally moving the nozzle 33 above the workpiece W. In this case, the treatment liquid L1 is spirally supplied from the center to the peripheral edge of the workpiece W or from the peripheral edge to the center of the workpiece W. In step S13, there is created a state in which the treatment liquid L1 remains so as to cover the entire upper surface of the resist film R on the surface Wa of the workpiece W.

Subsequently, the control device 100 causes the supply 40 to supply the cooling gas G1 from the discharge port 52 of the cooling gas nozzle 46 to the surface Wa of the workpiece W, i.e., the upper surface of the treatment liquid L1 (step S14). In step S14, the control device 100 may cause the cooling gas nozzle 46 to discharge the cooling gas G1 from the discharge port 47b toward the surface Wa while rotating the workpiece W by the substrate holder 20. At this time, it is desirable that the treatment liquid L1 on the surface Wa of the workpiece W is not blown off by the cooling gas G1. That is, it is desirable that the surface Wa of the workpiece W to which the treatment liquid L1 is supplied is not exposed by the injection of the cooling gas G1. By supplying the cooling gas G1 in a state in which the treatment liquid L1 remains on the surface Wa of the workpiece W, it is possible to continue the treatment with the treatment liquid L1 while adjusting a temperature of the surface of the workpiece W by supplying the cooling gas G1. More specifically, the temperature distribution on the surface Wa of the workpiece W is adjusted by adjusting the temperature of a partial region of the surface Wa of the workpiece W to which the cooling gas G1 is supplied.

Figure 13B:
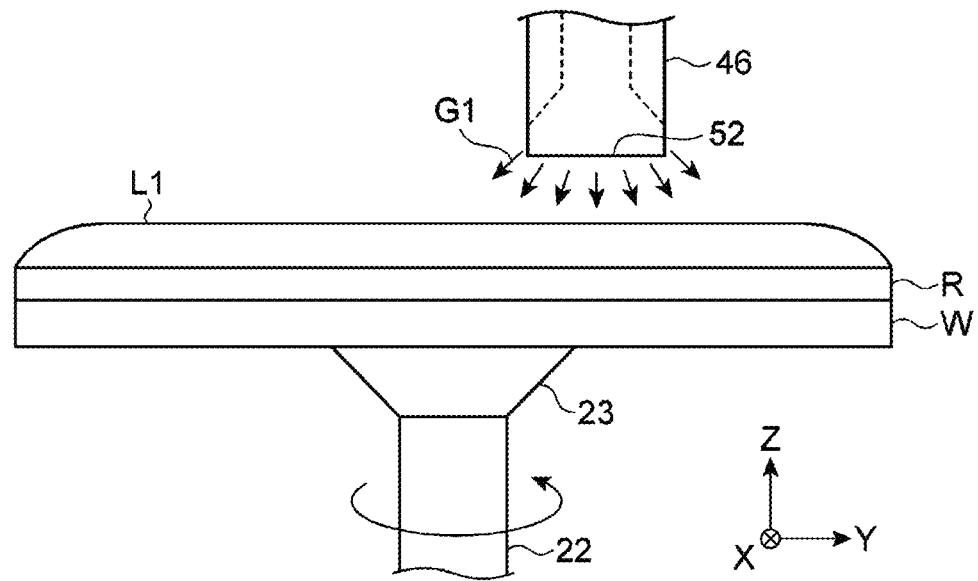
Figure 14:
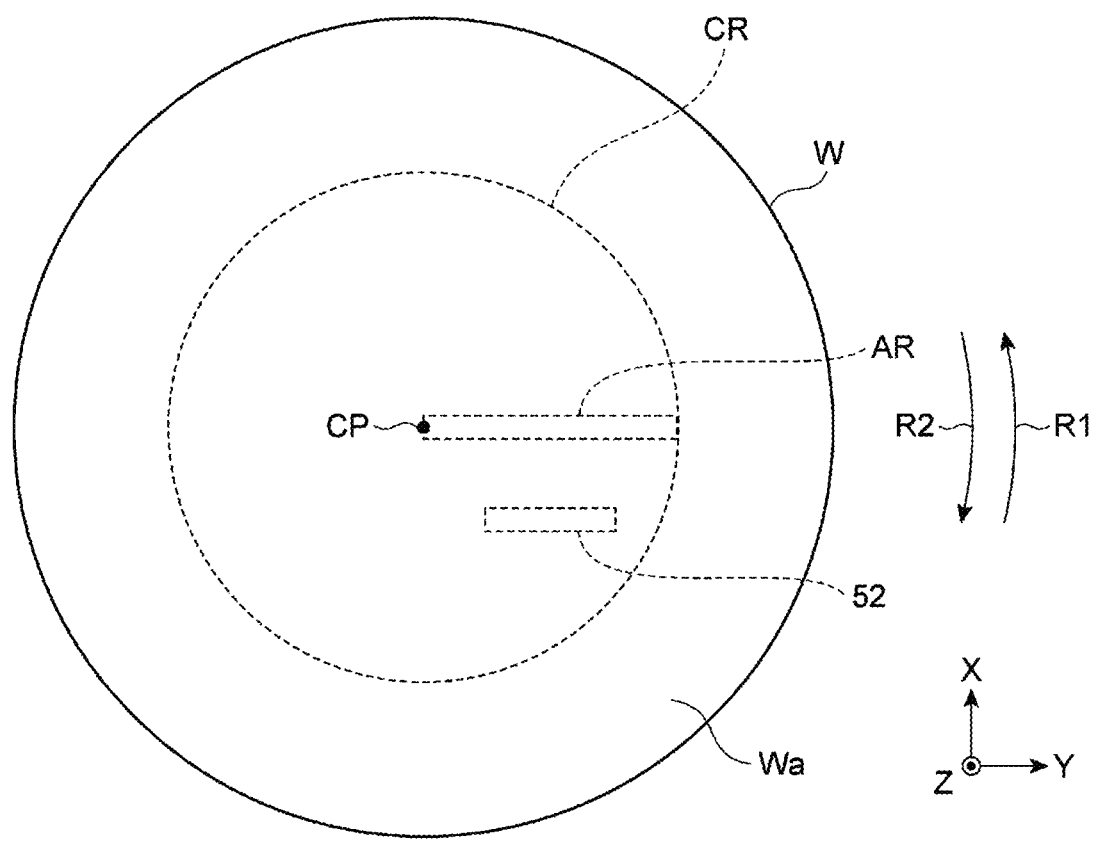
FIG. 14 is a schematic diagram for explaining an example of the liquid treatment method.

As shown in FIG. 13B, the cooling gas G1 is injected onto a region of the surface Wa of the workpiece W including at least the central portion. For example, as shown in FIG. 14, the control device 100 disposes the cooling gas nozzle 46 by the drive part 49 of the nozzle unit 43 so that the arrival region AR of the cooling gas G1 discharged from the cooling gas nozzle 46 extends along the radial direction of the workpiece W and one end of the arrival region AR in the longitudinal direction (the extension direction of the discharge port 52) substantially coincides with a center CP of the workpiece W. Hereinafter, the position of the cooling gas nozzle 46 disposed as described above is referred to as "discharge position." The control device 100 causes the substrate holder 20 to rotate the workpiece W in a state in which the cooling gas nozzle 46 is disposed at the discharge position. Further, the control device 100 controls the supply 40 so that the cooling gas G1 is discharged from the discharge port 52 of the cooling gas nozzle 46 while rotating the workpiece W by the substrate holder 20.

Since the cooling gas G1 from the discharge port 52 of the cooling gas nozzle 46 at the discharge position is discharged to the rotating workpiece W, the extension direction of the arrival region AR of the cooling gas G1 on the surface Wa is orthogonal to a rotation direction of the workpiece W (a direction R1 or a direction R2 in the FIG. 14). At this time, in the top view (when viewed from the Z-axis direction), a direction from the discharge port 52 toward the arrival region AR may be a forward direction with respect to the rotation direction of the workpiece W (that is, the workpiece W may be rotated in the direction R1). In the top view, the direction from the discharge port 52 toward the arrival region AR may be a reverse direction with respect to the rotation direction of the workpiece W (that is, the workpiece W may be rotated in the direction R2).

By discharging the cooling gas G1 from the cooling gas nozzle 46 as described above, the cooling gas G1 is supplied to the surface Wa in a range having a radius substantially equal to the width of the arrival region AR in the longitudinal direction (a central portion CR in FIG. 14). In addition, in the state in which the cooling gas nozzle 46 is disposed at the discharge position, the extension direction of the arrival region AR of the cooling gas G1 discharged from the discharge port 52 may not be orthogonal to, but may interest, the rotation direction of the workpiece W. That is, it is sufficient that the extension direction of the arrival region AR is not orthogonal to the radial direction of the workpiece W.

The injection of the cooling gas G1 to the treatment liquid L1 may be continued during a developing period of the resist film R. For example, after the treatment liquid L1 is supplied to the surface Wa of the workpiece W, the injection of the cooling gas G1 to the treatment liquid L1 may be continued until the developing process is completed or until the subsequent treatment is started. In step S14, the control device 100 may control the exhauster V2 to supply the cooling gas G1 to the surface Wa of the workpiece W, in a state in which exhausting the gas from the inside of the cup main body 71 is stopped, or in a state in which exhausting the gas from the inside of the cup main body 71 is continued.

Figure 15A:
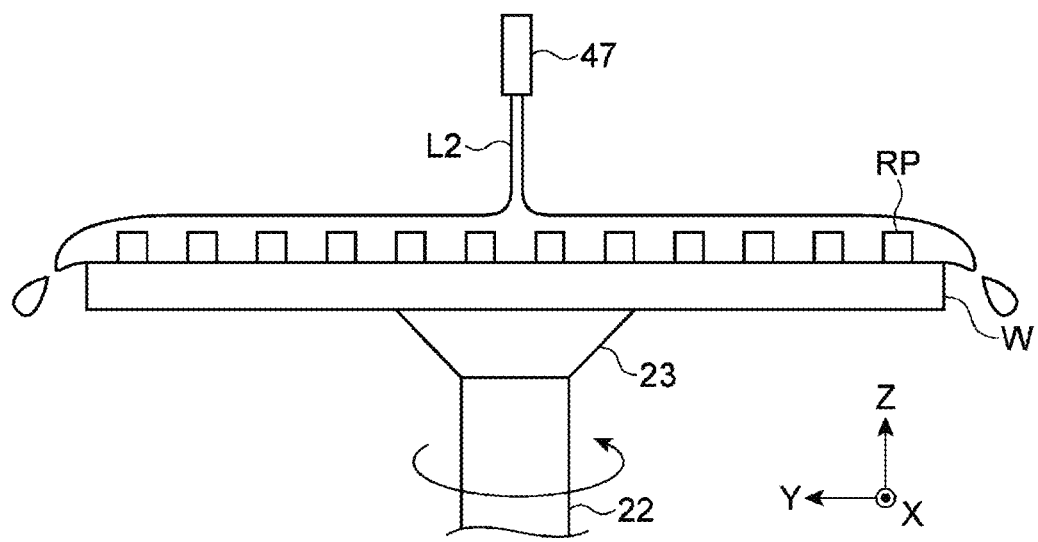
FIGS. 15A and 15B are schematic views for explaining an example of the liquid treatment method.

Subsequently, the control device 100 controls the substrate holder 20 and the supply 40 to cause the supply 40 to supply the treatment liquid L2 (rinsing liquid) to the surface Wa of the rotating workpiece W, i.e., the upper surface of the treatment liquid L1 from the treatment liquid nozzle 47 (step S15). As a result, as shown in FIG. 15A, a solution of the resist dissolved through the reaction with the treatment liquid L1 in the resist film R is washed away (discharged) together with the treatment liquid L1 from the surface Wa of the workpiece W by the treatment liquid L2. In this way, a resist pattern RP is formed on the surface Wa of the workpiece W.

Before starting the discharge of the treatment liquid L2 in step S15, the control device 100 causes the drive part 49 to displace the treatment liquid nozzle 47 (the holding arm 44) so that the arrival region of the treatment liquid L2 discharged from the treatment liquid nozzle 47 on the surface Wa is located at the center CP of the workpiece W. In the present embodiment, the drive part 49 does not displace the treatment liquid nozzle 47 in the direction intersecting the radial direction of the workpiece W, but displaces the treatment liquid nozzle 47 in the radial direction of the workpiece W. In step S15, the control device 100 may control the exhauster V2 to cause the supply 40 to supply the treatment liquid L2 to the surface Wa of the workpiece W in a state in which exhausting the gas from the inside of the cup main body 71 is continued. The exhaust amount of the gas discharged from the inside of the cup main body 71 in step S15 may be set to be larger than the exhaust amount of the gas discharged from the inside of the cup main body 71 in step S14.

Subsequently, the control device 100 causes the supply 40 to supply the drying gas G2 from the drying gas nozzle 45 to the surface Wa of the rotating workpiece W, i.e., the upper surface of the treatment liquid L2 remaining on the surface Wa (step S16). At the time when the drying gas G2 begins to be discharged in step S16, the control device 100 may move the holding arm 44 horizontally (in the Y-axis direction) by the drive part 49 so that the arrival position of the drying gas G2 substantially coincides with the center CP of the workpiece W. When the arrival position of the treatment liquid L2 discharged from the treatment liquid nozzle 47 on the surface Wa and the arrival position of the drying gas G2 discharged from the drying gas nozzle 45 on the surface Wa substantially coincide with each other in the Y-axis direction, the aforementioned movement of the holding arm 44 may be omitted. In an example of the arrangement relationship between the drying gas nozzle 45 and the treatment liquid nozzle 47 described above, the arrival position of the drying gas G2 and the arrival position of the treatment liquid L2 substantially coincide with each other at least in the X-axis direction (see FIG. 5). Therefore, it is not necessary to change the position of the holding arm 44 at least in the X-axis direction each time when the supply of the treatment liquid L2 is switched to the supply of the drying gas G2.

Figure 15B:
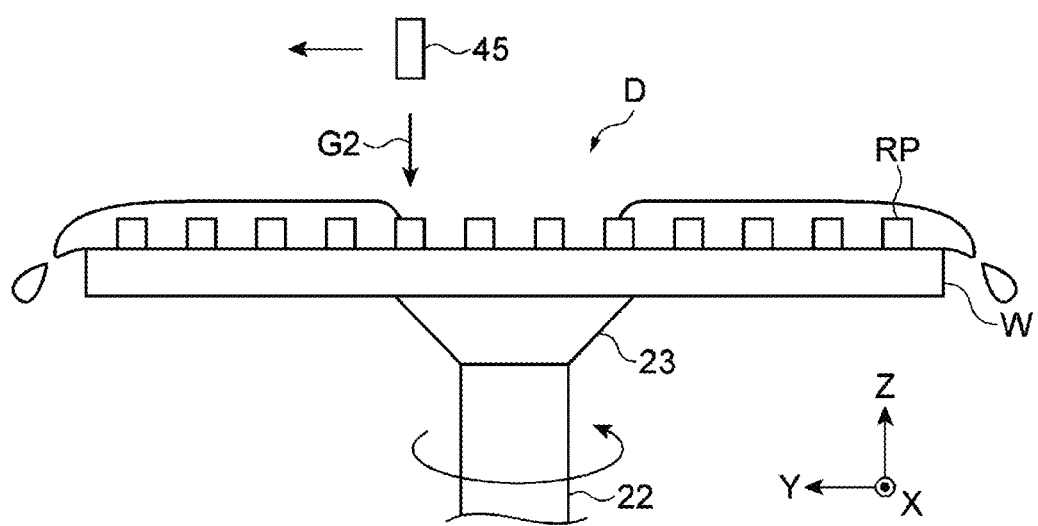

In step S16, the control device 100 may cause the drive part 49 to horizontally move the holding arm 44 so that the drying gas nozzle 45 moves from the center to the periphery of the workpiece W above the workpiece W. As a result, the treatment liquid L2 existing substantially at the center of the workpiece W is blown off toward the surroundings and evaporated. Thus, as shown in FIG. 15B, the dry region D is formed at the central portion of the workpiece W. As used herein, the term "dry region D" refers to a region in which the surface Wa of the workpiece W is exposed due to the evaporation of the treatment liquid L2, and also includes a case where a very small droplet amount (of, e.g., a micro-order) adheres to the surface Wa. The dry region D spreads from the central portion of the workpiece W toward the side of the peripheral edge by the centrifugal force generated due to the rotation of the workpiece W. After the dry region D is formed, the supply of the drying gas G2 from the drying gas nozzle 45 may be stopped.

In step S16, the control device 100 may control the exhauster V2 to supply the drying gas G2 to the surface Wa of the workpiece W in a state in which exhausting the gas from the inside of the cup main body 71 is continued. The exhaust amount of the gas discharged from the inside of the cup main body 71 in step S16 may be set to be larger than the exhaust amount of the gas discharged from the inside of the cup main body 71 in step S14.

After the supply of the drying gas G2 from the drying gas nozzle 45 is stopped, the treatment liquid L2 remaining on the surface Wa of the workpiece W spreads from the central portion of the workpiece W toward the side of the peripheral edge by the centrifugal force generated due to the rotation of the workpiece W. Thereafter, when the treatment liquid L2 on the surface Wa of the workpiece W is shaken off from the peripheral edge of the workpiece W, drying the workpiece W is completed. Thus, the liquid treatment of the workpiece W ends.

Effect of Embodiment

In the nozzle unit 43 described above, the cooling gas G1 is radially discharged from the discharge port 52 extending in the first direction (Y-axis direction) of the cooling gas nozzle 46. Therefore, the cooling gas G1 from the cooling gas nozzle 46 is supplied to the arrival region AR on the surface Wa of the workpiece W, which is longer than the width of the discharge port 52 in the first direction. Thus, the cooling gas G1 can be discharged by aligning the arrival region AR with the central portion of the workpiece W. As a result, by supplying the cooling gas G1 at the time of executing the developing process, the central portion of the workpiece W, which is the region to which the cooling gas G1 is discharged, is cooled further than the peripheral edge portion. Accordingly, it is possible to improve uniformity of the temperature distribution in the plane of the workpiece W.

When the cooling gas G1 is not used in the developing process, specifically, during the period between the supply of the developing liquid to the surface Wa of the workpiece W and the supply of the rinsing liquid, heat dissipation from the peripheral edge portion of the workpiece W is easily promoted due to an influence of exhausting the gas from the inside of the housing and the like. Therefore, a temperature difference may occur in the plane of the workpiece W. As a result, the developing speed may differ in the plane of the workpiece W, and the line width of the resist pattern in the plane of the workpiece W may vary. On the other hand, in the nozzle unit 43 according to the above embodiment, it is considered that an atmosphere near the upper surface of the developing liquid in the region to which the cooling gas G1 is supplied is replaced, and the cooling is performed by a vaporization heat generated due to vaporization of the developing liquid in the region rather than other regions. Since the cooling gas G1 is supplied from the cooling gas nozzle 46 with a certain pressure, the cooling gas G1 expands after being discharged from the cooling gas nozzle 46. As a result, it is considered that the temperature of the cooling gas G1 itself decreases (adiabatic expansion cooling), and the region on the surface Wa of the workpiece W to which the cooling gas G1 is discharged is cooled. In this way, the uniformity of the temperature distribution in the plane of the workpiece W can be improved by utilizing the fact that the surface Wa of the workpiece W can be locally cooled by supplying the cooling gas G1. Accordingly, it is possible to reduce variation in the line width of the resist pattern in the plane of the workpiece W.

In one example of the above embodiment, the cooling gas nozzle 46 is configured so that both ends of the discharge port 52 in the first direction can be visually recognized from the first direction. In this case, the cooling gas G1 can be discharged to a wider range on the workpiece W while suppressing an increase in the length of the discharge port 52 in the first direction. Accordingly, it is possible to simplify the nozzle unit 43.

In one example of the above embodiment, the central portion of the surface (opening surface) including the opening edge of the discharge port 52 in the first direction protrudes toward the surface Wa. In this case, difference in lengths of flow paths to the opening surface in the gas flow path 51 becomes small between the vicinity of the center (axis Ax) of the discharge port 52 and both ends of the discharge port 52 in the Y-axis direction. Thus, it is possible to improve the uniformity of the flow velocity of the cooling gas G1 discharged in the opening plane. As a result, in the arrival region AR of the cooling gas G1 on the surface Wa, it is possible to make uniform a degree of cooling by the cooling gas G1. Therefore, it is possible to further improve the uniformity of the temperature distribution in the plane of the workpiece W. For example, in the example shown in FIGS. 7A to 7C, the flow path at the corner when viewed from the front side may be longer than the flow path in other portions, and the flow velocity at the corner may be reduced. In the example shown in FIGS. 8A to 8C, the surface (opening surface) including the opening edge of the discharge port 52 is curved and has no corner when viewed from the front side. Therefore, there is no concern that the flow velocity becomes lower than that in other portions. This makes it possible to further improve the uniformity of the flow velocity.

The nozzle unit 43 according to the above embodiment further includes the drying gas nozzle 45 having the discharge port 45b for discharging the drying gas G2 toward the surface Wa, and the drive part 49 configured to move the cooling gas nozzle 46 and the drying gas nozzle 45 together along the surface Wa. In this case, the two nozzles can be moved by one drive part 49. Therefore, the nozzle unit 43 including the drive part 49 can be simplified as compared with the case where these two nozzles are moved by individual drive parts.

In the above embodiment, the flow velocity of the cooling gas G1 discharged from the discharge port 52 of the cooling gas nozzle 46 is smaller than the flow velocity of the drying gas G2 discharged from the discharge port 45b of the drying gas nozzle 45. In this case, the cooling gas nozzle 46 and the drying gas nozzle 45 can be used for the processing that requires a gas in such an amount that does not blow off the liquid on the surface Wa and the processing that requires a gas in such an amount that blows off the liquid on the surface Wa.

The nozzle unit 43 according to the above embodiment further includes the treatment liquid nozzle 47 having the discharge port 47b for discharging the treatment liquid L2 toward the surface Wa. The drive part 49 moves the cooling gas nozzle 46, the drying gas nozzle 45, and the treatment liquid nozzle 47 together. In this case, the three nozzles can be moved by one drive part 49. Therefore, the nozzle unit 43 can be simplified as compared with the case where there are provided drive parts for moving these three nozzles individually.

In the above embodiment, the cooling gas nozzle 46 and the treatment liquid nozzle 47 are disposed at different positions in the second direction (X-axis direction) orthogonal to the first direction and extending along the surface Wa. The cooling gas nozzle 46 and the treatment liquid nozzle 47 are configured so that the distance in the second direction between the arrival position (arrival region AR) of the cooling gas G1 discharged from the cooling gas nozzle 46 on the surface Wa and the arrival position of the treatment liquid L2 discharged from the treatment liquid nozzle 47 on the surface Wa becomes smaller than the distance in the second direction between the discharge port 52 of the cooling gas nozzle 46 and the discharge port 47b of the treatment liquid nozzle 47. In this case, it is possible to shorten a switching time between the processing (step S14) using the cooling gas G1 discharged from the cooling gas nozzle 46 and the processing (step S15) using the treatment liquid L2 discharged from the treatment liquid nozzle 47.

In the above embodiment, the drying gas nozzle 45 and the treatment liquid nozzle 47 are disposed at different positions from each other in the second direction. The drying gas nozzle 45 and the treatment liquid nozzle 47 may be configured so that when viewed from the first direction, the inclination of the discharge direction of the treatment liquid L2 from the treatment liquid nozzle 47 with respect to the surface Wa becomes smaller than the inclination of the discharge direction of the drying gas G2 from the drying gas nozzle 45 with respect to the surface Wa. In this case, it is possible to suppress the influence of the treatment liquid L2 discharged from the treatment liquid nozzle 47 on the surface Wa as compared with a case where the treatment liquid L2 is discharged from the treatment liquid nozzle 47 substantially perpendicularly to the surface Wa.

In the above embodiment, the cooling gas nozzle 46, the drying gas nozzle 45, and the treatment liquid nozzle 47 are disposed in this order in the second direction. In this case, the nozzle unit 43 can be configured so that the gas supply paths to the drying gas nozzle 45 and the cooling gas nozzle 46 become short.

The coating and developing apparatus 2 according to the above embodiment includes the nozzle unit 43, the substrate holder 20 configured to hold and rotate the workpiece W with the surface Wa thereof facing upward, and the control device 100 configured to control the nozzle unit 43 and the substrate holder 20. The control device 100 causes the cooling gas nozzle 46 to discharge the cooling gas G1 so that the extension direction of the arrival region AR of the cooling gas G1 on the surface Wa intersects the rotation direction (direction R1 or R2) of the workpiece W in a state in which the workpiece W is rotated by the substrate holder 20, whereby the cooling gas nozzle 46 is caused to supply the gas to the region of the surface Wa including the central portion CR. In this case, the cooling gas G1 discharged from the cooling gas nozzle 46 can be diffused along the circumferential direction at the central portion CR of the surface Wa, and the temperature of the central portion CR can be reduced as compared with the peripheral edge portion of the workpiece W. Accordingly, it is possible to reduce the temperature difference between the central portion and the peripheral edge portion in the plane of the workpiece W.

In the liquid treatment method according to the above embodiment, by supplying the gas (cooling gas G1), the workpiece W is cooled in the region to which the gas is supplied. In this case, by supplying the gas so as to diffuse in the radial direction rather than the circumferential direction of the workpiece W, the central portion is cooled further than the peripheral edge portion. Accordingly, it is possible to improve the uniformity of the temperature distribution in the plane of the workpiece W.

In the above embodiment, during the period in which the gas is supplied to the treatment liquid L1 remaining on the workpiece W, the flow rate and the flow velocity of the gas may be adjusted so that the surface of the workpiece W is not exposed by the movement of the treatment liquid L1 due to the supply of the gas. In this case, a part of the region on the workpiece W suitable for a temperature sensitivity (cooling sensitivity) of a chemical liquid can be cooled so that adverse effects on the liquid treatment by the impact of the gas, such as roughening or breaking the film of the treatment liquid L1, do not occur.

Figure 16A:
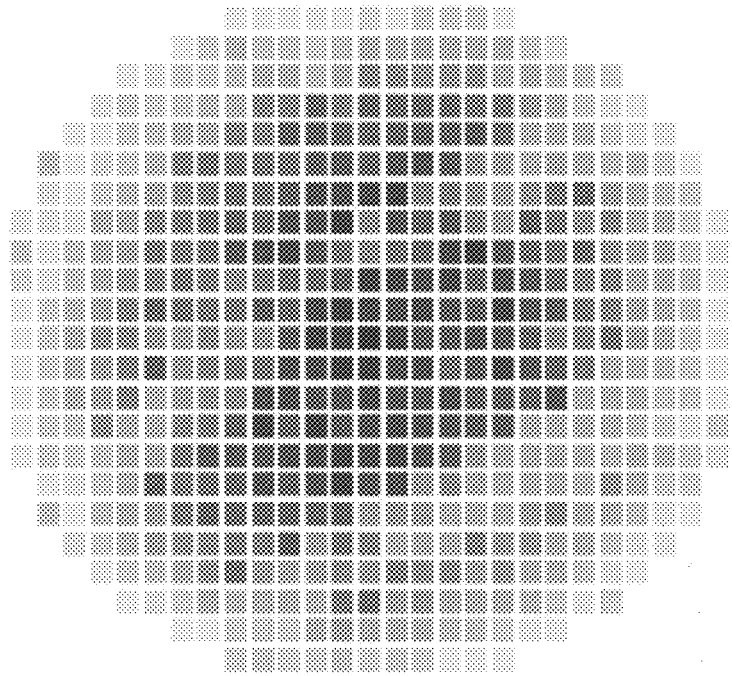
FIG. 16A is a diagram showing an example of an in-plane temperature distribution when a cooling gas is not supplied.
Figure 16B:
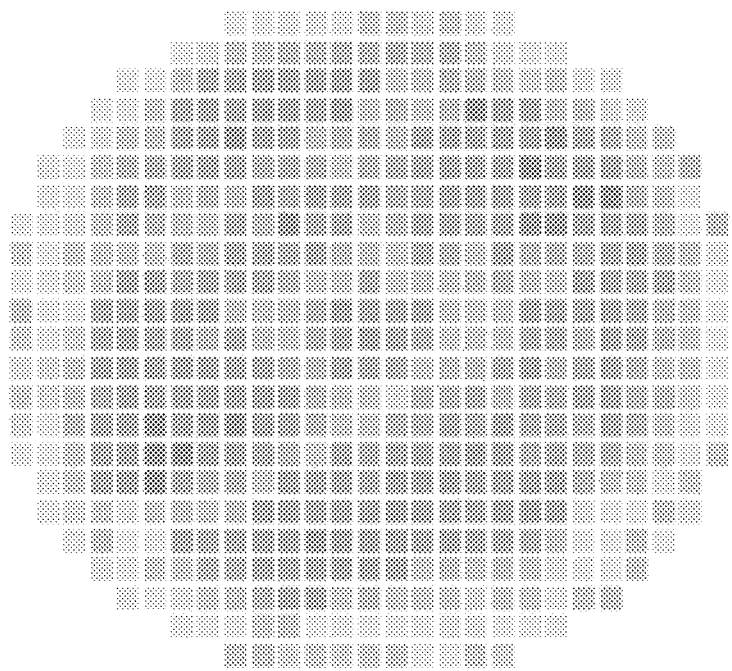
FIG. 16B is a diagram showing an example of an in-plane temperature distribution when the cooling gas is supplied.

Effects of the present embodiment will be further described with reference to FIGS. 16A to 17. FIG. 16A is a diagram showing a temperature distribution (in-plane temperature distribution) on the surface Wa of the workpiece W when the cooling gas is not supplied, i.e., when the above-described step S14 (see FIG. 12) is omitted. Each temperature of the surface Wa shown in FIG. 16A is a measurement result after a predetermined time during which the developing process for the resist film R proceeds has elapsed from the end of the supply of the developing liquid in step S13. On the other hand, FIG. 16B is a diagram showing an in-plane temperature distribution of the surface Wa of the workpiece W when the supply of the cooling gas of step S14 is performed. Each temperature of the workpiece W shown in FIG. 16B is a measurement result of the temperature on the surface Wa after the same predetermined time as described above has elapsed from the end of step S13 while performing step S14.

In FIGS. 16A and 16B, a magnitude of the temperature is indicated by color density. The measured temperature increases as the color becomes darker. From the result shown in FIG. 16A, it can be seen that when the cooling gas is not supplied, the temperature at the central portion is higher than that at the peripheral edge portion of the workpiece W. On the other hand, from the result shown in FIG. 16B, it can be seen that by supplying the cooling gas to the central portion of the workpiece W, the temperature of the central portion is reduced to the same level as that of the peripheral edge portion, so that the temperature difference between the central portion and the peripheral edge portion becomes smaller than the result shown in FIG. 16A.

Figure 17:
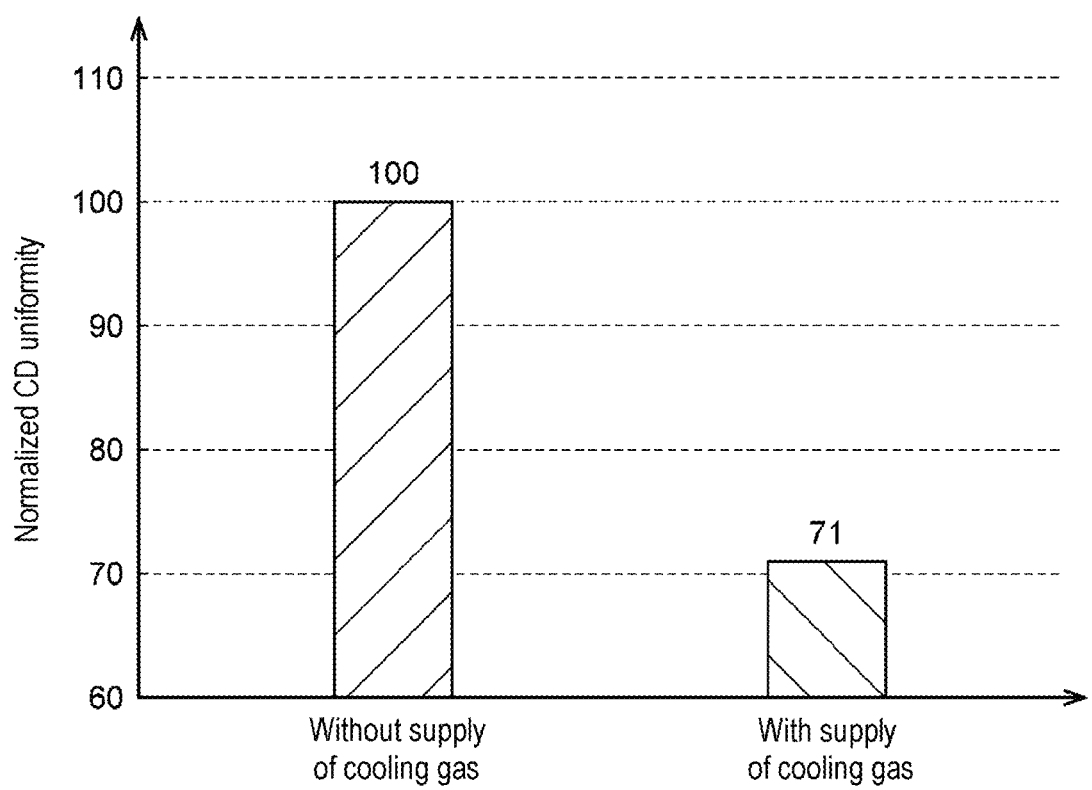
FIG. 17 is a graph showing an example of a variation in an in-plane line width distribution.

FIG. 17 shows a comparison result of variations (standard deviations) of in-plane line width distribution. In FIG. 17, there is shown a comparison result when the standard deviation without supplying the cooling gas is assumed to be 100. The standard deviation is reduced to 71 when the cooling gas is supplied. That is, it can be seen that uniformity of the in-plane line width distribution is improved by about 30% by supplying the cooling gas.

Modification

It should be noted that the disclosure of the subject specification is exemplary in all respects and not restrictive. Various omissions, substitutions, changes, and the like may be made to the above examples within the scope of the claims and the gist thereof.

Regarding Method of Supplying Cooling Gas

In the explanation of the series of procedures described above, it was explained that various methods can be adopted for the supply of the cooling gas G1 from the cooling gas nozzle 46. However, by optimizing a timing and method of injecting the cooling gas G1 into the treatment liquid L1, it is possible to improve the uniformity of the in-plane temperature distribution on the surface Wa of the workpiece W. As a result, for example, it is possible to improve the uniformity of the line width (CD) of the resist film R in the processed (developed) workpiece W. This point will be described.

First, a result of studying a supply timing of the cooling gas G1 will be described. As described with reference to FIG. 12, the cooling gas G1 is supplied to the surface Wa (the upper surface of the resist film R) of the workpiece W after the supply 30 is caused to supply the treatment liquid L1 (developing liquid) (step S13). Further, the cooling gas G1 is supplied to the upper surface of the surface Wa (treatment liquid L1) of the workpiece W before the treatment liquid L2 (rinsing liquid) is supplied from the treatment liquid nozzle 47 (step S15).

During the period from the completion of supplying the treatment liquid L1 to the surface Wa of the workpiece W (step S13) to the start of supplying the treatment liquid L2 (rinsing liquid) (step S15), the control device 100 secures a time required for the treatment liquid L1 to remain on the surface Wa of the workpiece W. The time period between the supply of the treatment liquid L1 to the surface Wa of the workpiece W (step S13) and the supply of the treatment liquid L2 (rinsing liquid) (step S15) is a time zone in which the treatment liquid L1 remains on the surface Wa of the workpiece W. Therefore, this time zone is referred to as "maintenance period." The maintenance period includes a time for supplying the cooling gas G1 (step S14). The supply of the cooling gas G1 need not be performed during the entire maintenance period between the supply of the treatment liquid L1 to the surface Wa of the workpiece W (step S13) and the supply of the treatment liquid L2 (rinsing liquid) (step S15), but may be performed only in a part of the maintenance period.

An example of the case where the cooling gas G1 is supplied in a part of the maintenance period may include a configuration in which the cooling gas G1 is not supplied in the first half of the maintenance period, and the cooling gas G1 is supplied in the second half of the maintenance period. That is, the first half of the maintenance period may be a period during which the cooling gas G1 is not supplied (non-supply period). The non-supply period referred to here is, for example, a period longer than a period during which the supply of the cooling gas G1 may be stopped due to operations related to a normal liquid treatment, such as moving each of the respective components of the liquid treatment unit U1 including the cooling gas nozzle 46, opening and closing a valve provided in the flow path of the gas or the treatment liquid, and the like.

By adopting the configuration in which the cooling gas G1 is supplied only in the second half of the maintenance period, it is possible to reduce the temperature difference on the surface Wa of the workpiece W in the middle of the maintenance period, and to improve the uniformity of the line width of the resist pattern in the plane of the workpiece W. This point will be described with reference to FIGS. 18A to 19.

Figure 18A:
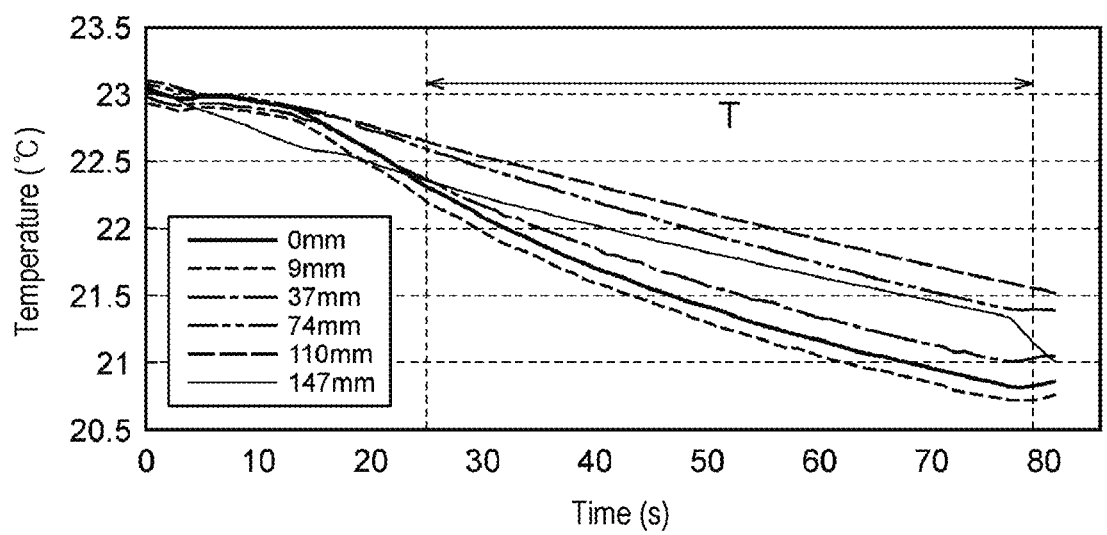
FIGS. 18A and 18B are diagrams showing examples of a result of measuring a temperature change on a surface of a workpiece caused by supplying a cooling gas to the surface of the workpiece.
Figure 18B:
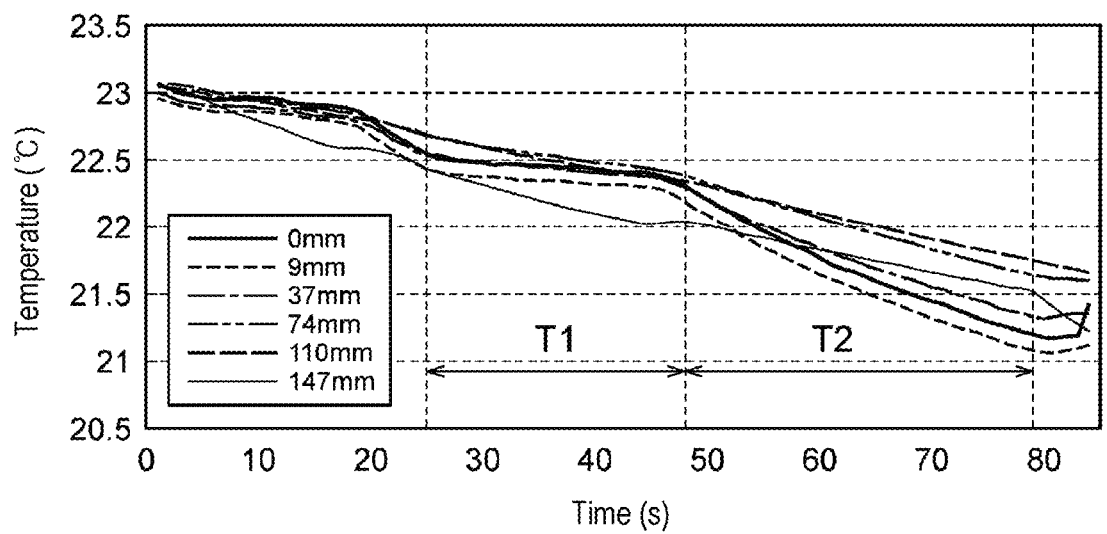

FIGS. 18A and 18B show measurement results of change in the temperature of the surface Wa of the workpiece W due to the supply of the cooling gas G1 to the surface Wa of the workpiece W. FIG. 18A shows a result when the cooling gas G1 is supplied over an entire maintenance period T. Further, FIG. 18B shows a result when the cooling gas G1 is not supplied during a first half period T1 of the maintenance period and the cooling gas G1 is supplied during a second half period T2. Further, in each of FIGS. 18A and 18B, there are shown the measurement results of the temperature changes at measurement points distanced from the center of the workpiece W by 0 mm, 9 mm, 37 mm, 74 mm, 110 mm, and 147 mm. The workpiece W used for this evaluation has a disk shape with a radius of 147 mm. In addition, in FIG. 18A and FIG. 18B, conditions of disposing the cooling gas nozzle 46 for supplying the cooling gas G1 are the same. Specifically, the cooling gas nozzle 46 is disposed so that the arrival region AR of the cooling gas G1 discharged from the cooling gas nozzle 46 extends along the radial direction of the workpiece W, and the center of the arrival region AR in the longitudinal direction lies at a position moved 50 mm outward from the center of the workpiece W. The center of the arrival region AR in the longitudinal direction refers to the center of the discharge port 52 in the extension direction.

As shown in FIG. 18A, when the cooling gas G1 is supplied during the entire maintenance period T, temperature differences among the measurement points increase with the lapse of time from the supply of the cooling gas G1 (the lapse of time from the start time of the maintenance period T). On the other hand, according to the results shown in FIG. 18B, temperature difference among the measurement points are smaller than the result shown in FIG. 18A in both the first half period T1 and the second half period T2 of the maintenance period. On the surface Wa of the workpiece W to which the treatment liquid L1 has been supplied, the temperature difference at each point at each time may affect the progress of the treatment by the treatment liquid L1 (e.g., the developing process by the developing liquid when the treatment liquid L1 is a developing liquid). Therefore, it is considered that the temperature differences among the measurement points at each time during the maintenance period T are related to variation in the treatment result by the treatment liquid L1 on the surface Wa of the workpiece W. Thus, by adopting the configuration in which the cooling gas G1 is supplied during a part of the maintenance period as shown in FIG. 18B, it is possible to suppress variations in the progress of the treatment on the surface Wa of the workpiece W. As a result, it is possible to suppress variations in the treatment result.

Figure 19:
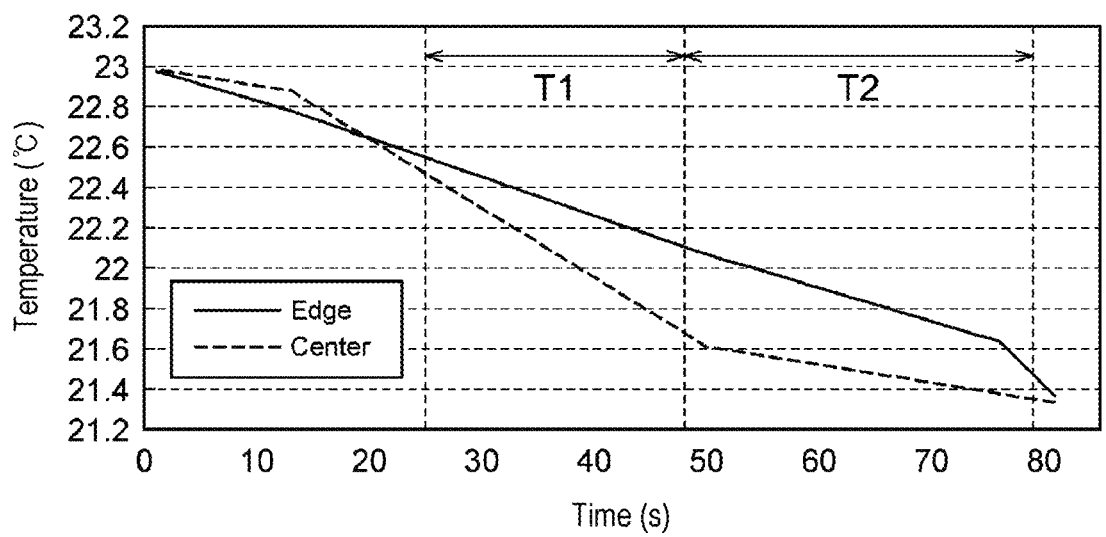
FIG. 19 is a diagram showing an example of a result of simulating a temperature change on a surface of a workpiece when a cooling gas supply period is changed during a maintenance period.

FIG. 19 shows a result of simulating the temperature change of the surface Wa of the workpiece W when the cooling gas G1 is supplied in the first half period T1 of the maintenance period and the cooling gas G1 is not supplied in the second half period T2 of the maintenance period. That is, as compared with the condition shown in FIG. 18B, the period in which the cooling gas G1 is supplied and the period in which the cooling gas G1 is not supplied are reversed. Further, FIG. 19 shows simulation results for the peripheral edge portion (Edge) and the center (Center) of the workpiece W. When the cooling gas G1 is supplied during the first half of the maintenance period T1 as shown in FIG. 19, a state in which a temperature difference between the measurement points increases along with the lapse of time from the supply of the cooling gas G1 is maintained until the maintenance period comes to an end (until the second period T2 comes to an end). This tendency is similar to the result shown in FIG. 18A, in which the temperature differences among the measurement points increase along with the lapse of time from the start time of the maintenance period T. Although the temperature difference is small in the second half period T2, a certain temperature difference is maintained until the end of the second half period T2 as shown in FIG. 19. From this, it can be noted that by setting the conditions shown in FIG. 18B, it is possible to suppress variations in the progress of the treatment on the surface Wa of the workpiece W. That is, it is considered that, by supplying the cooling gas G1 in the second half period T2 of the maintenance period T2 and not supplying the cooling gas G1 in the first half period T1 (non-supply period), it is possible to enhance the effect of suppressing the variations in the result of treatment on the surface Wa of the workpiece W due to the supply of the cooling gas G1.

Figure 20:
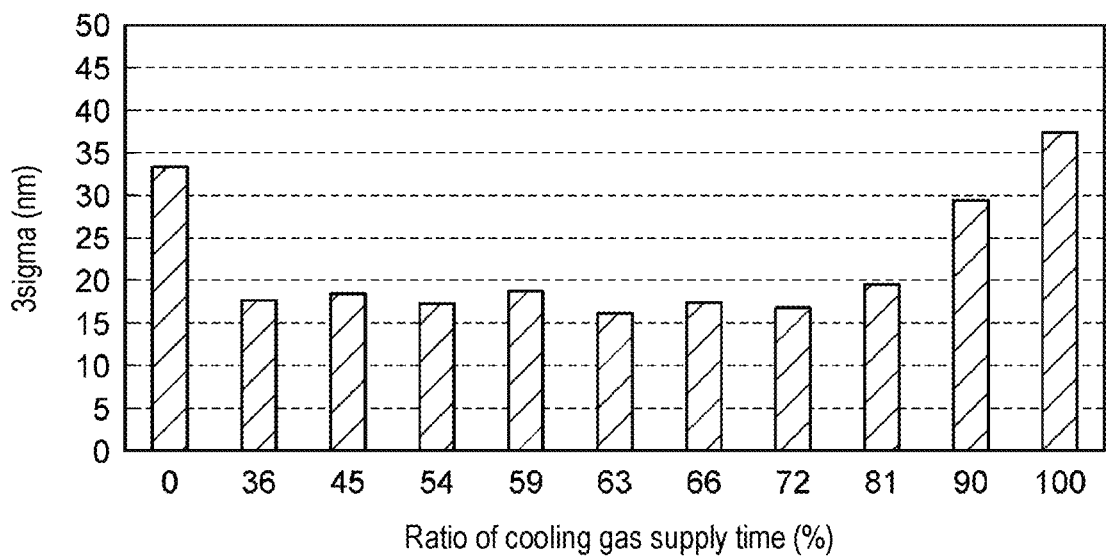
FIG. 20 is a diagram showing a position example of a result of evaluating a correspondence relationship between a ratio of a cooling gas supply period in a total maintenance period and a variation in a line width of a resist pattern in a plane of a workpiece.

FIG. 20 shows a result of evaluating correspondence relationship between a ratio of a period for supplying the cooling gas G1 in the entire maintenance period and variation in the line width of the resist pattern in the plane of the workpiece W when the treatment liquid L1 is a developing liquid. In FIG. 20, the ratio of 0% on the horizontal axis indicates a result available when the cooling gas G1 is not supplied, and the ratio of 100% indicates a result available when the cooling gas G1 is supplied over the entire maintenance period. Further, each number between 0% and 100% on the horizontal axis indicates how much the second period T2 for supplying the cooling gas G1 was changed with respect to the entire maintenance period when the cooling gas G1 is supplied in the second half period T2 as in the result shown in FIG. 18B. For example, the ratio of 72% indicates that the supply time of the cooling gas G1 was controlled so that the ratio of the first half period T1 (non-supply period) is 28% of the entire maintenance period, and the ratio of the supply period of the cooling gas G1, i.e., the second half period T2 is 72%. In addition, the "3sigma" on the vertical axis indicates 3sigma related to the variation in the measurement result of the line width of the resist pattern under each condition.

Figure 21A:
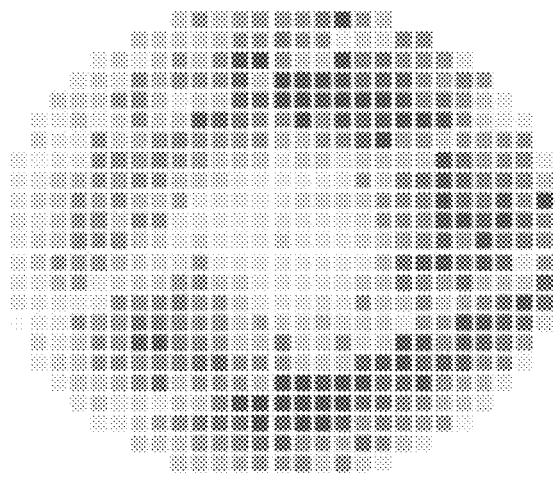
FIG. 21A is a diagram showing an example of an in-plane temperature distribution on a surface of a workpiece when a supply ratio of a cooling gas is 45%.
Figure 21B:
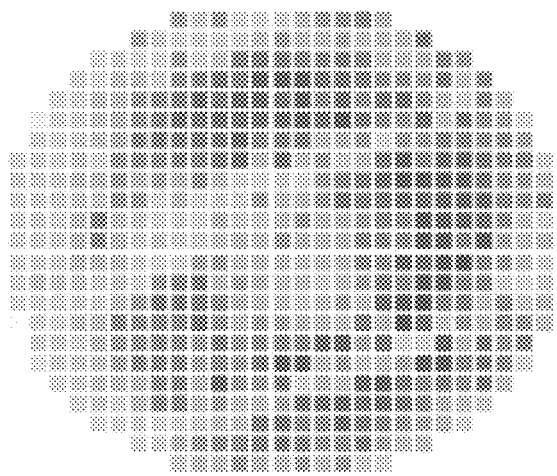
FIG. 21B is a diagram showing an example of an in-plane line width (CD) distribution on a surface of a workpiece when a supply ratio of a cooling gas is 63%.
Figure 21C:
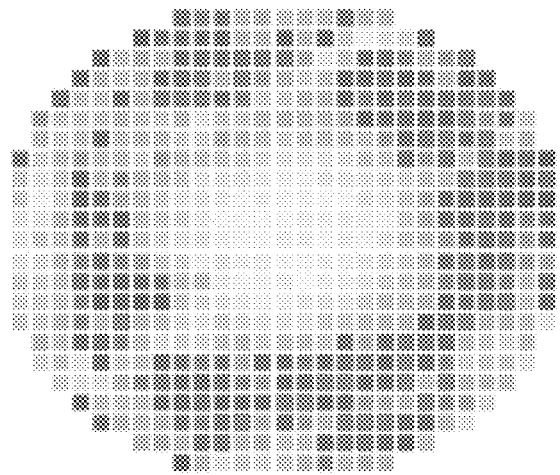
FIG. 21C is a diagram showing an example of an in-plane line width (CD) distribution on a surface of a workpiece when a supply ratio of a cooling gas is 81%.

Further, FIGS. 21A to 21C are diagrams (contour diagram) showing distribution of the line width (CD) on the surface Wa of the workpiece W (the in-plane line width (CD) distribution) under conditions of the ratio of 45%, the ratio of 63%, and the ratio of 81% among the conditions shown in FIG. 20. FIG. 21A shows a result at the ratio of 45%, FIG.

21B shows a result at the ratio of 63%, and FIG. 21C shows the result at the ratio of 81%. All of these results are results measured after the maintenance period related to the supply of the cooling gas G1 has elapsed. In FIGS. 21A to 21C, as in FIGS. 16A and 16B, a size of the line width (CD) is shown by color density, indicating that the measured line width (CD) increases as the color becomes darker.

In the results shown in FIG. 20, it is estimated that the results at the ratios of 36% to 81% have the same degree of 3sigma and the same degree of variation in line width. On the other hand, according to the results shown in FIGS. 21A to 21C, it can be seen that even when the 3sigma is about the same degree, according to the results shown in FIG. 21A (the ratio of 45%) and FIG. 21C (the ratio of 81%), the line width in the central portion is smaller (thinner) than that in the peripheral edge portion of W. On the other hand, in the result shown in FIG. 21B (the ratio of 63%), it was confirmed that deviation of the line width between the center and the peripheral edge portion of the workpiece W is small. As described above, even when the 3sigma is about the same level, there may be a case where the line width deviates in the plane and a case where the line width does not deviate in the plane. From the combination of the result of 3sigma of the line width of the resist pattern shown in FIG. 20 and the results of FIGS. 21A to 21C showing the deviation of the in-plane line width (CD) on the surface Wa of the workpiece W, it is possible to specify an optimum time for supplying the cooling gas G1.

According to FIGS. 20 to 21C, for example, when the ratio of the supply time of the cooling gas G1 in the second half period T2 of the maintenance period is set to 63%, as compared with the cases where the ratio is 45% and 81%, the variation in the line width of the resist pattern can be reduced to the same extent (see FIG. 20). On the other hand, when the ratio of the supply time of the cooling gas G1 in the second half period T2 is set to 63%, as compared with the cases where the ratio is 45% and 81%, the deviation of the line width in the plane can be reduced. In addition, it is considered that such a condition also varies significantly depending on the types of the resist liquid and the developing liquid, the size of the resist pattern, the supply amount (speed) of cooling gas G1, and the like. Accordingly, by adjusting the timing of supplying the cooling gas G1 according to changes in manufacturing conditions, it is possible to specify supply conditions of the cooling gas G1 that can further suppress the variation in the line width of the resist pattern according to the manufacturing conditions.

Figure 22A:
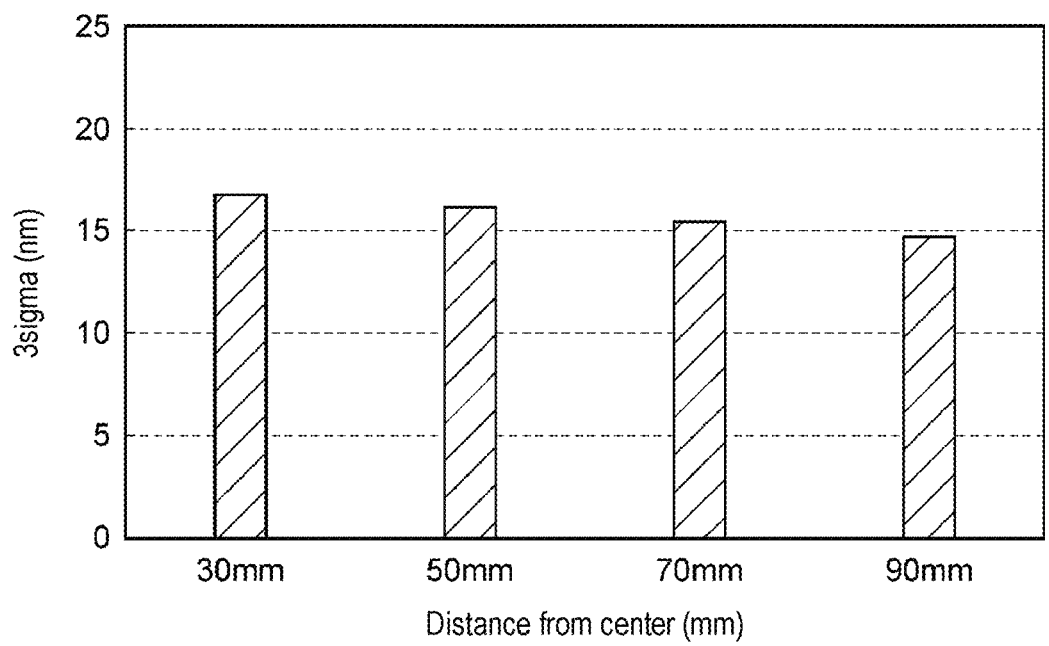
FIGS. 22A and 22B are diagrams showing examples of a result of evaluating how much a variation in a line width of a resist pattern is changed when a supply position of a cooling gas is changed.
Figure 22B:
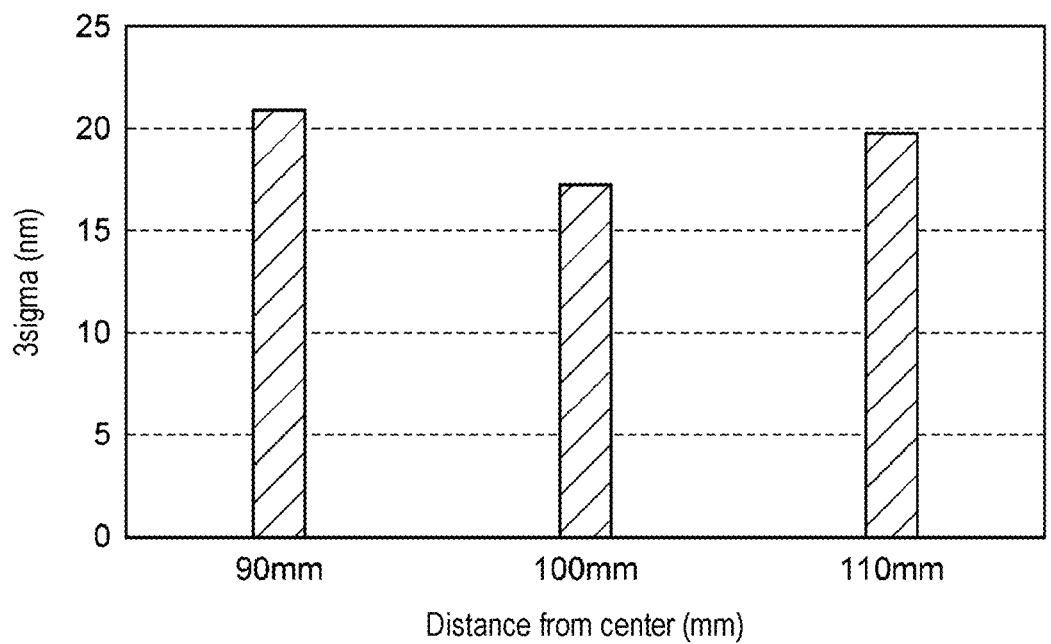

FIGS. 22A and 22B show results of evaluating how much the variation in the line width of the resist pattern is changed when the supply position of the cooling gas G1 is changed. FIGS. 22A and 22B show results available when a treatment is performed on the surface Wa of the workpiece W under the same conditions except for the cooling gas nozzle 46. In each case, the cooling gas nozzle 46 is disposed so that the arrival region AR of the cooling gas G1 discharged from the cooling gas nozzle 46 extends along the radial direction of the workpiece W. Further, the cooling gas nozzle 46 is disposed so that the center of the arrival region AR in the longitudinal direction (the extension direction of the discharge port 52) lies at positions moved outward by 30 mm, 50 mm, 70 mm, 90 mm, 100 mm, and 110 mm from the center of the workpiece W. In addition, the length of the arrival region AR in the longitudinal direction by the cooling gas nozzle 46 is about 80 mm, and the radius of the workpiece W is 147 mm Therefore, in the case of "30 mm from the center," the arrival region AR overlaps with the center of the workpiece W. The horizontal axis in FIGS. 22A and 22B indicates the aforementioned "distance from the center." Further, the 3sigma on the vertical axis indicates 3sigma related to variation in a measurement result of the line width of the resist pattern under each condition. FIGS. 22A and 22B show results of evaluation performed at different timings. Therefore, although both FIGS. 22A and 22B include the result of "90 mm," the result of 3sigma on the vertical axis varies.

According to the result shown in FIG. 22A, the 3sigma decreases as the distance from the center increases. Therefore, the variation in the line width of the resist pattern of the workpiece W is reduced by moving the cooling gas nozzle 46 from the center to the outside. On the other hand, according to the result shown in FIG. 22B, when the distance from the center of the cooling gas nozzle 46 is 100 mm, the variation in the line width of the resist pattern of the workpiece W is small. Therefore, by disposing the cooling gas nozzle 46 such that the distance from the center of the cooling gas nozzle 46 becomes 100 mm, it is possible to suppress the variation in the line width of the resist pattern. It is considered that such a condition also varies significantly depending on the types of the resist liquid and the developing liquid, the size of the resist pattern, the supply amount (speed) of the cooling gas G1, and the like. Accordingly, by adjusting the position of the cooling gas nozzle 46 for supplying the cooling gas G1 according to changes in the manufacturing conditions, it is possible to specify the supply conditions of the cooling gas G1 that can suppress the variation in the line width of the resist pattern according to the manufacturing conditions.

As in the above modifications, the maintenance period T from creating, on the entire (substantially entire) workpiece W, a state in which the treatment liquid L1 remains on the workpiece W to starting removal of the treatment liquid from the workpiece W may include the non-supply period during which the gas is not supplied. In this case, cooling status of the workpiece W cooled by the gas can be adjusted by providing the non-supply period in which the gas is not supplied in the maintenance period T. Accordingly, it is possible to improve the uniformity of the temperature distribution in the plane.

In addition, the non-supply period may be provided in the first half of the maintenance period. By providing the non-supply period in the first half of the maintenance period T, it is possible to improve the uniformity of the temperature distribution in the plane of the workpiece W throughout the maintenance period. In addition, a period for supplying the gas may be provided before the non-supply period. As described above, which period in the maintenance period is set as the non-supply period is not particularly limited and may be changed as appropriate.

Further, the gas may be supplied while rotating the workpiece W so that the gas reaches a region on the workpiece W that does not include the center of the workpiece W. As described above, when the gas is supplied while rotating the workpiece W, if the cooling gas nozzle 46 is disposed so that the gas reaches the center of the workpiece W, there may be a difference in the supply amount of the gas between the center of the workpiece W and the peripheral edge portion. Therefore, by adjusting the supply position so that the gas does not reach the center, it is possible to more uniformly perform the cooling by the gas.

Regarding Other Modifications

Next, modifications other than the supply condition of the cooling gas G1 will be described. In the nozzle unit 43 of the above-described examples, the drying gas nozzle 45, the cooling gas nozzle 46, and the treatment liquid nozzle 47 are connected to one another and moved together by one drive part 49. However, the nozzle unit 43 may include a drive part for moving two nozzles, and a drive part for moving the remaining one nozzle. In this case, the two nozzles moved by one drive part may be connected to each other, and the one nozzle moved by the other drive part may not be connected to the two nozzles. Alternatively, the nozzle unit 43 may have three drive parts that individually move these three nozzles, and these three nozzles may not be connected to one another. The nozzle unit 43 may not include at least one of the drying gas nozzle 45 and the treatment liquid nozzle 47.

In the nozzle unit 43 of the above-described examples, when viewed from the Y-axis direction (the extension direction of the discharge port 52), the arrival positions of the gases and the treatment liquid supplied from the drying gas nozzle 45, the cooling gas nozzle 46, and the treatment liquid nozzle 47 on the surface Wa substantially coincide with one another. However, the relationship among the arrival positions is not limited thereto. The arrival positions of the gases and the like supplied by any two of these three nozzles may substantially coincide with each other, and the arrival position of the gas or the like supplied by the remaining one nozzle may differ from the arrival positions of the gases and the like supplied by the two nozzles. The arrival positions of the gases and the like supplied by the three nozzles may differ from one another. Depending on these arrival positions, the discharge directions of the gases and the like from the discharge ports of the three nozzles may be different from those of the above-described examples.

The arrangement (order) of the drying gas nozzle 45, the cooling gas nozzle 46, and the treatment liquid nozzle 47 in the X-axis direction is not limited to the above-described examples. These three nozzles may be arranged in any order. The height relationship among the discharge ports of these three nozzles is not limited to the above-described examples. The discharge port of any nozzle may be located higher than the discharge ports of the other two nozzles. The height positions of any two nozzles may substantially coincide with each other, or the height positions of the discharge ports of the three nozzles may substantially coincide with one another.

The liquid treatment unit U1 that performs a liquid treatment other than the developing process may include the same nozzle unit 43 as described above. The coating and developing apparatus 2 (substrate processing system 1) is not limited to the above-described examples, and may have any configuration as long as it includes at least a nozzle unit including a gas nozzle having a discharge port extending in one direction and configured to radially discharge a gas.

According to the present disclosure, it is possible to provide a nozzle unit and liquid treatment apparatus capable of improving uniformity of a temperature distribution in a plane of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A nozzle unit for a liquid treatment apparatus that performs a liquid treatment on a substrate using a liquid, the nozzle unit comprising:
   a first gas nozzle having a discharge flow path for allowing a first gas to flow through the discharge flow path and a first discharge port for discharging the first gas flowing through the discharge flow path toward a surface of the substrate;
   a second gas nozzle having a second discharge port for discharging a second gas toward the surface; and
   a drive part configured to move the first gas nozzle and the second gas nozzle together along the surface,
   wherein the first discharge port is formed so as to extend in a first direction along the surface, and
   wherein an inner width of the discharge flow path in the first direction increases as the discharge flow path approaches the first discharge port, so that the first gas is discharged radially from the first discharge port.

2. The nozzle unit of claim 1, wherein the first gas nozzle is configured so that both ends of the first discharge port in the first direction is visually recognizable when viewed from the first direction.

3. The nozzle unit of claim 2, wherein a central portion of a plane of the first discharge port including an opening edge in the first direction protrudes toward the surface.

4. The nozzle unit of claim 1, wherein a flow velocity of the first gas discharged from the first discharge port is smaller than a flow velocity of the second gas discharged from the second discharge port.

5. The nozzle unit of claim 1, further comprising:
   a treatment liquid nozzle having a third discharge port for discharging a treatment liquid toward the surface,
   wherein the drive part is configured to move the first gas nozzle, the second gas nozzle, and the treatment liquid nozzle together.

6. The nozzle unit of claim 5, wherein the first gas nozzle and the treatment liquid nozzle are arranged at different positions from each other in a second direction orthogonal to the first direction and extending along the surface, and
   wherein the first gas nozzle and the treatment liquid nozzle are configured so that a distance in the second direction between an arrival position of the first gas from the first gas nozzle on the surface and an arrival position of the treatment liquid from the treatment liquid nozzle on the surface becomes smaller than a distance in the second direction between the first discharge port and the third discharge port.

7. The nozzle unit of claim 6, wherein the second gas nozzle and the treatment liquid nozzle are arranged at different positions from each other in the second direction, and
   wherein the second gas nozzle and the treatment liquid nozzle are configured so that when viewed from the first direction, an inclination of a discharge direction of the treatment liquid from the treatment liquid nozzle with respect to the surface is smaller than an inclination of a discharge direction of the second gas from the second gas nozzle with respect to the surface.

8. The nozzle unit of claim 6, wherein the first gas nozzle, the second gas nozzle, and the treatment liquid nozzle are arranged sequentially with respect to the second direction.

9. A liquid treatment apparatus, comprising:
the nozzle unit of claim 1;
a substrate holding unit configured to hold and rotate the substrate with the surface facing upward; and
a control unit configured to control the nozzle unit and the substrate holding unit,
wherein the control unit is configured to supply the first gas by the first gas nozzle to a region including a central portion of the surface by causing the first gas nozzle to discharge the first gas in a state in which the substrate is rotated by the substrate holding unit, so that an extension direction of an arrival region of the first gas on the surface intersects a rotation direction of the substrate.

* * * * *